US012575438B2

(12) United States Patent
Yim et al.

(10) Patent No.: US 12,575,438 B2
(45) Date of Patent: Mar. 10, 2026

(54) SEMICONDUCTOR PACKAGE

(71) Applicant: SAMSUNG ELECTRONICS CO., LTD., Suwon-si (KR)

(72) Inventors: Choongbin Yim, Suwon-si (KR); Jiyong Park, Suwon-si (KR); Jinwoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 332 days.

(21) Appl. No.: 18/361,530

(22) Filed: Jul. 28, 2023

(65) Prior Publication Data

US 2024/0153855 A1     May 9, 2024

(30) Foreign Application Priority Data

Nov. 9, 2022     (KR) ........................ 10-2022-0148604

(51) Int. Cl.
*H01L 23/48*          (2006.01)
*H01L 23/00*          (2006.01)
          (Continued)

(52) U.S. Cl.
CPC .. *H01L 23/49822* (2013.01); *H01L 23/49816* (2013.01); *H01L 24/16* (2013.01);
          (Continued)

(58) Field of Classification Search
CPC ... H01L 23/49822; H01L 24/32; H01L 24/48; H01L 25/0652; H01L 2224/16227;
          (Continued)

(56) References Cited

U.S. PATENT DOCUMENTS 8,482,117 B2     7/2013   Kobayashi et al.
9,449,953 B1     9/2016   Shih et al.
          (Continued)

FOREIGN PATENT DOCUMENTS

JP          2019-212887 A     12/2019
KR          10-2041661          11/2019
          (Continued)

OTHER PUBLICATIONS

Office Action dated Jan. 12, 2026 issued in corresponding to Korean Patent Application No. 10-2022-0148604.

*Primary Examiner* — Theresa T Doan
(74) *Attorney, Agent, or Firm* — Morgan, Lewis & Bockius LLP

(57)          ABSTRACT

A semiconductor package includes a first redistribution structure; a third redistribution structure electrically connected to the first redistribution structure; a first semiconductor chip disposed between the first redistribution structure and the third redistribution structure; a second semiconductor chip disposed between the first redistribution structure and the third redistribution structure; and a second redistribution structure disposed between the second semiconductor chip and the first redistribution structure, wherein the first semiconductor chip does not overlap the second redistribution structure in a direction in which the first redistribution structure and the third redistribution structure face each other.

20 Claims, 19 Drawing Sheets

(51) Int. Cl.
    H01L 23/498      (2006.01)
    H01L 23/52       (2006.01)
    H01L 25/065      (2023.01)

(52) U.S. Cl.
    CPC .............. *H01L 24/32* (2013.01); *H01L 24/48* (2013.01); *H01L 25/0652* (2013.01); *H01L 2224/16227* (2013.01); *H01L 2224/32146* (2013.01); *H01L 2224/48091* (2013.01); *H01L 2224/48227* (2013.01); *H01L 2225/1052* (2013.01); *H01L 2225/1058* (2013.01); *H01L 2924/1432* (2013.01); *H01L 2924/1434* (2013.01); *H01L 2924/1811* (2013.01)

(58) Field of Classification Search
    CPC . H01L 2224/32146; H01L 2224/48091; H01L 2224/48227; H01L 2225/1052; H01L 25/105; H01L 25/0655; H01L 25/50; H01L 2225/0651; H01L 2225/06548; H01L 2225/1035; H01L 2225/1041; H01L 23/5385; H01L 23/5389; H01L 24/20; H01L 23/3107; H01L 24/07; H01L 25/18; H01L 2224/02331; H01L 2224/0235; H01L 2224/02373; H01L 2224/02379

USPC ......................................................... 257/774
    See application file for complete search history.

(56)                References Cited

U.S. PATENT DOCUMENTS

| | | | |
|---|---|---|---|
| 10,867,966 | B2 | 12/2020 | Chen et al. |
| 11,393,763 | B2 | 7/2022 | Ho et al. |
| 2012/0223426 | A9* | 9/2012 | Shim .................. H01L 23/3107 257/737 |
| 2012/0299174 | A1* | 11/2012 | Choi .................. H01L 25/0657 257/692 |
| 2014/0183731 | A1 | 7/2014 | Lin et al. |
| 2014/0210080 | A1 | 7/2014 | Chang et al. |
| 2017/0053898 | A1 | 2/2017 | Yeh et al. |
| 2018/0218985 | A1 | 8/2018 | Tsai et al. |
| 2021/0272906 | A1 | 9/2021 | Kim et al. |
| 2022/0013441 | A1 | 1/2022 | Liu et al. |

FOREIGN PATENT DOCUMENTS

| | | |
|---|---|---|
| KR | 10-2022-0102542 A | 7/2022 |
| KR | 10-2022-0144107 A | 10/2022 |

* cited by examiner

300d

SEMICONDUCTOR PACKAGE

CROSS-REFERENCE TO RELATED APPLICATION(S)

This application claims priority under 35 U.S.C. § 119 to Korean Patent Application No. 10-2022-0148604, filed on Nov. 9, 2022, in the Korean Intellectual Property Office, the disclosure of which is incorporated by reference herein in its entirety.

TECHNICAL FIELD

The present disclosure relates to a semiconductor package, and more particularly to a semiconductor package including a semiconductor chip disposed on multiple redistribution structures.

DISCUSSION OF RELATED ART

In general, a semiconductor chip may be implemented as a semiconductor package such as a wafer level package (WLP) or a panel level package (PLP). The semiconductor package may be used as an electronic component of a device.

The semiconductor package may include a redistribution layer for electrically connecting the semiconductor chip to the device or a printed circuit board. The redistribution layer may have a structure in which redistributions extend horizontally. The redistributions may be finer than interconnections of an interconnection layer of a general printed circuit board.

The redistribution layer may be electrically connected to a bump to vertically extend an electrical connection path. The bump may belong to an under bump metallurgy (UBM), which may improve efficiency of an electrical connection between the redistribution layer and the bump.

To increase the complexity and performance of a semiconductor chip, a degree of integration of the semiconductor package may be increased and a size of the semiconductor package may be decreased. However, as the degree of integration of the semiconductor package increases or the size thereof decreases, relative to unit performance, a probability of a defect in the semiconductor package may increase.

For example, when a semiconductor package includes a plurality of semiconductor chips, a probability that the semiconductor package is not defective may be proportional to a product of the probabilities of a non-defective semiconductor chip across all of the semiconductor chips of the semiconductor package. Therefore, as the number of semiconductor chips included in a semiconductor package increases, a probability of a defect in the semiconductor package may increase.

SUMMARY

According to an aspect of the present inventive concept, a semiconductor package is provided in which a sub-semiconductor package capable of being verified in advance is embedded.

According to an aspect of the present inventive concept, a semiconductor package includes a first redistribution structure; a third redistribution structure electrically connected to the first redistribution structure; a first semiconductor chip disposed between the first redistribution structure and the third redistribution structure; a second semiconductor chip disposed between the first redistribution structure and the third redistribution structure; and a second redistribution structure disposed between the second semiconductor chip and the first redistribution structure, wherein the first semiconductor chip does not overlap the second redistribution structure in a direction in which the first redistribution structure and the third redistribution structure face each other.

According to an aspect of the present inventive concept, a semiconductor package includes a first redistribution structure in which at least one first redistribution layer and at least one first insulating layer are alternately stacked; a first semiconductor chip disposed on a surface of the first redistribution structure; a third semiconductor chip disposed on the surface of the first redistribution structure; a second semiconductor chip disposed between the third semiconductor chip and the first redistribution structure; a second redistribution structure disposed between the second semiconductor chip and the first redistribution structure, and in which at least one second redistribution layer and at least one second insulating layer are alternately stacked; a second encapsulant surrounding the second semiconductor chip and surrounding the third semiconductor chip on a surface of the second redistribution structure; and a first encapsulant surrounding the first semiconductor chip and surrounding the second encapsulant on the surface of the first redistribution structure.

According to an aspect of the present inventive concept, a semiconductor package includes a first redistribution structure in which at least one first redistribution layer and at least one first insulating layer are alternately stacked; a third redistribution structure electrically connected to the first redistribution structure and in which at least one third redistribution layer and at least one third insulating layer are alternately stacked; a first semiconductor chip disposed between the first redistribution structure and the third redistribution structure; a second semiconductor chip disposed between the first redistribution structure and the third redistribution structure; a third semiconductor chip disposed between the second semiconductor chip and the third redistribution structure; a second encapsulant disposed between the first redistribution structure and the third redistribution structure, surrounding the second semiconductor chip, and surrounding the third semiconductor chip; a first encapsulant disposed between the first redistribution structure and the second redistribution structure, surrounding the first semiconductor chip, and surrounding the second encapsulant; a second redistribution structure disposed between the second semiconductor chip and the first redistribution structure, and in which at least one second redistribution layer and at least one second insulating layer are alternately stacked, wherein the second redistribution structure is disposed directly on the first redistribution structure, and wherein the first semiconductor chip does not overlap the second redistribution structure in a direction in which the first redistribution structure and the third redistribution structure face each other.

According to an aspect of the present inventive concept, a method of manufacturing a semiconductor package includes: providing a sub-semiconductor package comprising a second semiconductor chip electrically connected to a second redistribution structure in which at least one second redistribution layer and at least one second insulating layer are alternately stacked and a third semiconductor chip electrically connected to the second redistribution structure; encapsulating the sub-semiconductor package in a second encapsulant that contacts and surrounds the second semiconductor chip and the third semiconductor chip; mounting the sub-semiconductor package on a first redistribution structure in which at least one first redistribution layer and at least one first insulating layer are alternately stacked and on which a first semiconductor chip is mounted; and encapsulating the first semiconductor chip in a first encapsulant different than the second encapsulant, wherein the first semiconductor chip does not overlap the second redistribution structure in a direction in which the sub-semiconductor package is mounted on the first redistribution structure.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1A:
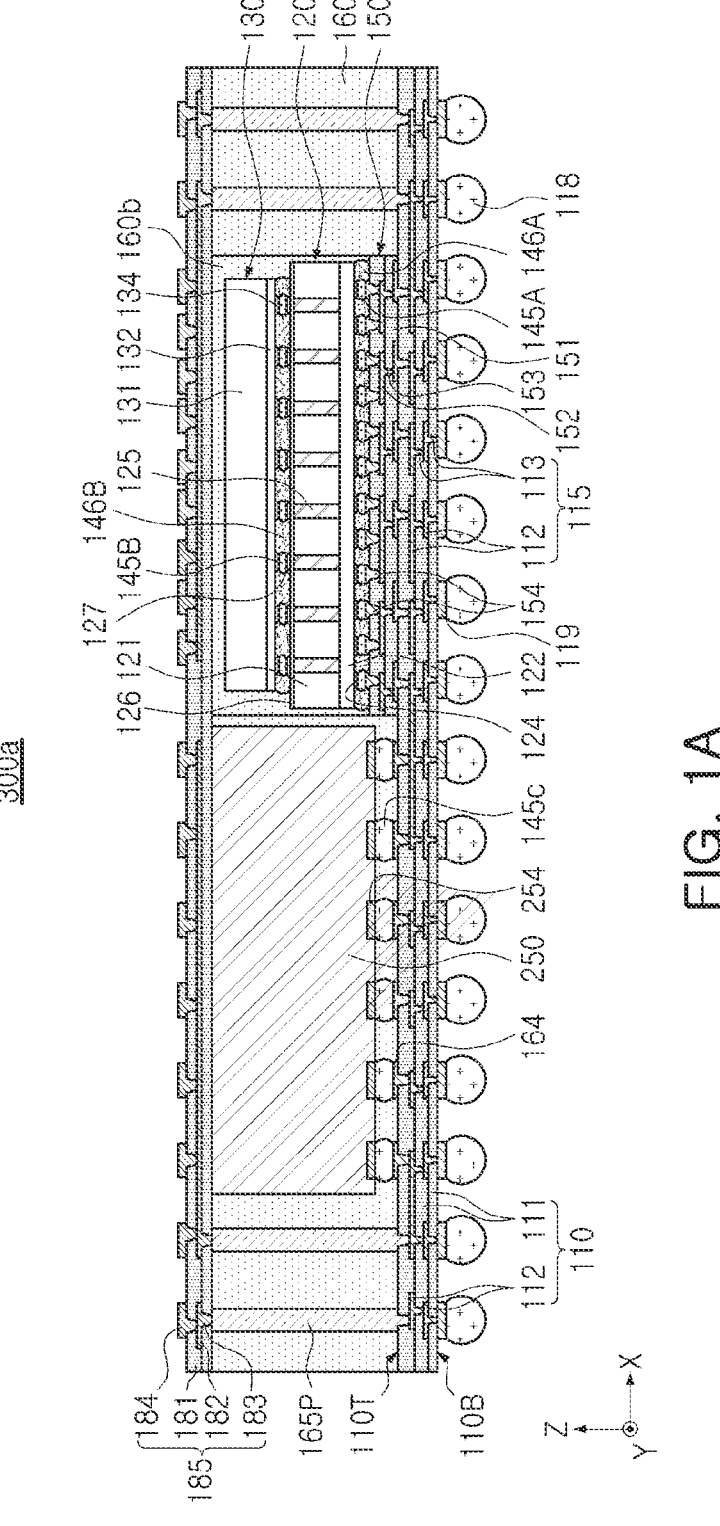
FIG. 1A, FIG. 1B, FIG. 1C, and FIG. 1D are cross-sectional views illustrating a cross-section of a semiconductor package according to an embodiment, taken along an X-Z plane.

The following detailed description of the present disclosure refers to the accompanying drawings, which illustrate, by way of example, embodiments of the present disclosure that may be practiced. Embodiments are described in sufficient detail to enable those skilled in the art to practice aspects of the present disclosure. It should be understood that various embodiments of the present disclosure may be different, but need not be mutually exclusive. For example, certain features, structures, and characteristics described herein may be implemented in other embodiments without departing from the spirit and scope of the present disclosure in connection with one embodiment. It may be also to be understood that the position or arrangement of the individual components within an embodiment may be varied without departing from the spirit and scope of the present disclosure. The following detailed description is, therefore, not to be taken in a limiting sense, and the scope of the pre sent disclosure may only be to be limited by the appended claims, along with the full scope of equivalents to which such claims are entitled. In the drawings, like reference numerals refer to the same or similar functions throughout the several views.

Hereinafter, embodiments of the present disclosure will be described in detail with reference to the accompanying drawings such that those skilled in the art may easily carry out aspects of the present disclosure.

Referring to FIG. 1A, FIG. 1B, FIG. 1C, and FIG. 1D, a semiconductor package (300*a*, 300*b*, 300*c*, or 300*d*) according to some embodiments includes a first redistribution structure 110, a third redistribution structure 185, a first semiconductor chip 250, a second semiconductor chip 120, and a second redistribution structure 150. For example, the semiconductor package (300*a*, 300*b*, 300*c*, or 300*d*) may be a system in package (SIP) including two or more semiconductor chips.

The first redistribution structure 110 may have a structure in which at least one first redistribution layer 112 and at least one first insulating layer 111 are alternately stacked. The first redistribution structure 110 may further include first vias 113 extending from the at least one first redistribution layer 112 in a stacking direction (e.g., a Z-direction) of the first redistribution structure 110. The first vias 113 may pass through the at least one first insulating layer 111.

The at least one first insulating layer 111 may include an insulating material. For example, the at least one first insulating layer 111 may include a thermosetting resin such as an epoxy resin, or a thermoplastic resin such as polyimide. For example, the at least one first insulating layer 111 may include a photosensitive insulating material such as a photoimageable dielectric (PID) resin. Alternatively, the at least one first insulating layer 111 may include a resin mixed with an inorganic filler, for example, an Ajinomoto build-up film (ABF). Alternatively, the at least one first insulating layer 111 may include a prepreg, a flame retardant (FR-4), or bismaleimide triazine (BT) material. The at least one first insulating layer 111 may include the same or different materials, and depending on materials and processes constituting each layer, a boundary therebetween may not be distinguishable.

First redistribution layers 112 and the first vias 113 may form first electrical paths 115. In the figures, leads lines for the first redistribution layers 112 point to a first one of the first electrical paths 115, and the leads lines for the first vias 113 point to a second one of the first electrical paths 115. Each of the first electrical paths 115 is formed by ones of the first redistribution layers 112 and the first vias 113 connected to each other.

The first redistribution layers 112 may be disposed in a linear shape on an X-Y plane. The first vias 113 may have a cylindrical shape having side surfaces of which widths become narrow in a downward direction or an upward direction (e.g., in the Z-direction). The first vias 113 are illustrated as a filled via structure in which an internal space is completely filled with a conductive material but are not limited thereto. For example, the first vias 113 may have a conformal via shape in which a metal material is formed along an inner wall of a via hole.

The first redistribution layers 112 and the first vias 113 may include a conductive material. The first redistribution layers 112 and the first vias 113 may include, for example, copper (Cu), aluminum (Al), silver (Ag), tin (Sn), gold (Au), nickel (Ni), lead (Pb), titanium (Ti), or alloys thereof.

The third redistribution structure 185 may be electrically connected to the first redistribution structure 110. The third redistribution structure 185 may have a structure in which at least one third redistribution layer 182 and at least one third insulating layer 181 are alternately stacked. The third redistribution structure 185 may further include third vias 183 vertically connected to the at least one third redistribution layer 182 and passing through the at least one third insulating layer 181. The third redistribution structure 185 may further include a third UBM 184 electrically connected to the third vias 183 and disposed on an upper surface of the third redistribution structure 185. Since the third redistribution structure 185 may be implemented in a similar manner to the first redistribution structure 110, the third redistribution layer 182 may be implemented in a similar manner to the first redistribution layers 112. The third insulating layer 181 may be implemented in a similar manner to the first insulating layer 111, and the third vias 183 may be implemented in a similar manner to the first vias 113.

For example, conductive posts 165P included in the semiconductor package (300a, 300b, 300c, or 300d) may vertically connect the third redistribution structure 185 and the first redistribution structure 110. The conductive posts 165P may pass through a first encapsulant 160a. The conductive posts 165P may be formed earlier than the first encapsulant 160a. The conductive posts 165P may be formed by a process of plating a metal material (e.g., copper) or a process of filling a conductive paste, in through-holes of a photo resist temporarily formed earlier than the first encapsulant 160a.

The first semiconductor chip 250 may be disposed between the first redistribution structure 110 and the third redistribution structure 185. The first semiconductor chip 250 may be disposed on one surface 110T of the first redistribution structure 110 and may be electrically connected to the at least one first redistribution layer 112. For example, the first semiconductor chip 250 may include connection pads 254 disposed on a lower surface of the first semiconductor chip 250. The first semiconductor chip 250 may be electrically connected to the at least one first redistribution layer 112 through the connection pads 254. For example, the connection pads 254 may include a conductive material such as tungsten (W), aluminum (Al), copper (Cu), or the like. The connection pads 254 may be a pad of a bare chip, for example, an aluminum (Al) pad, according to some embodiments. The connection pads 254 may be a pad of a packaged chip, for example, a copper (Cu) pad, according to some embodiments.

For example, the first semiconductor chip 250 may include a body portion containing a semiconductor material such as silicon (Si), germanium (Ge), gallium arsenide (GaAs), or the like, and a device layer disposed below the body portion and including an integrated circuit (IC). The first semiconductor chip 250 may include a logic semiconductor chip and/or a memory semiconductor chip. The logic semiconductor chip may be a microprocessor, and may be, for example, a central processing unit (CPU), a graphic processing unit (GPU), a field programmable gate array (FPGA), an application processor (AP), a digital signal processor, a cryptographic processor, a controller, or an application specific integrated circuit (ASIC). The memory semiconductor chip may be a volatile memory such as a dynamic random access memory (DRAM), a static random access memory (SRAM), or the like, or a non-volatile memory such as a flash memory or the like.

The second semiconductor chip 120 may be disposed between the first redistribution structure 110 and the third redistribution structure 185. The second semiconductor chip 120 may be disposed on the one surface 110T of the first redistribution structure 110. The second semiconductor chip 120 may be electrically connected to the at least one first redistribution layer 112. The second semiconductor chip 120 may be implemented in a similar manner to the first semiconductor chip 250. For example, the second semiconductor chip 120 may include a body portion 121 containing a semiconductor material such as silicon (Si), germanium (Ge), gallium arsenide (GaAs), or the like, and a device layer 122 disposed below the body portion and including an integrated circuit (IC). For example, the second semiconductor chip 120 may be a logic semiconductor chip, and the first semiconductor chip 250 may be a memory semiconductor chip. The first semiconductor chip 250 and the second semiconductor chip 120 may be electrically connected to each other through the first redistribution layer 112 of the first redistribution structure 110.

The second redistribution structure 150 may be disposed between the second semiconductor chip 120 and the first redistribution structure 110. The second redistribution structure 150 may have a structure in which at least one second redistribution layer 152 and at least one second insulating layer 151 are alternately stacked. The second redistribution structure 150 may further include second vias 153 vertically connected to the at least one second redistribution layer 152 and passing through the at least one second insulating layer 151. The second redistribution structure 150 may further include a second UBM 154 electrically connected between the second vias 153 and the second semiconductor chip 120 and disposed on an upper surface of the second redistribution structure 150. The second redistribution layers 152 may be implemented in a similar manner to the first redistribution layers 112, the second insulating layer 151 may be implemented in a similar manner to the first insulating layer 111, and the second vias 153 may be implemented in a similar manner to the first vias 113.

The first semiconductor chip 250 may not overlap the second redistribution structure 150 in a direction in which the first redistribution structure 110 and the third redistribution structure 185 face each other (e.g., the Z-direction). For example, a horizontal size of the second redistribution structure 150 may be smaller than a horizontal size of each of the first redistribution structure 110 and the third redistribution structure 185. For example, the second redistribution structure 150 and the second semiconductor chip 120 may be horizontally offset from centers of the first redistribution structure 110 and the third redistribution structure 185 in one direction (e.g., in an X-direction).

A combined structure of the second redistribution structure 150 and the second semiconductor chip 120 may be a sub-semiconductor package capable of being verified in advance. For example, the combined structure of the second redistribution structure 150 and the second semiconductor chip 120 may be verified before being embedded in the semiconductor package (300a, 300b, 300c, or 300d). For example, probes of a tester used for verification may be moved into contact with a position electrically connected to the second redistribution layers 152 on a lower surface of the second redistribution structure 150. The tester may be used to verify whether the combined structure of the second redistribution structure 150 and the second semiconductor chip 120 is defective using resistance values measured by the tester. When the combined structure of the second redistribution structure 150 and the second semiconductor chip 120 is defective, the combined structure may include a defect. The defect may result in the combined structure being discarded.

Considering general sizes of the probes of the tester, a line width or a pitch of the connection pad 124 of the second semiconductor chip 120 may be too small for the tester to directly verify. Therefore, assuming that the second semiconductor chip 120 is disposed to directly contact the first redistribution structure 110, the second semiconductor chip 120 may not be verified before being disposed, and may be verified through a lower surface of the first redistribution structure 110. In this case, due to nature of a process for manufacturing a semiconductor package, structures of an upper portion of the first redistribution structure 110 may be in an almost complete state. When the second semiconductor chip 120 is defective without being verified before being disposed, the combined structure of the first redistribution structure 110 and the structures (e.g., the semiconductor chips, the encapsulants, and the conductive posts) of the upper portion thereof may include a defect. The defect may result in the combined structure being discarded.

Therefore, compared to a structure in which the second semiconductor chip 120 is disposed to directly contact the first redistribution structure 110, in the semiconductor package (300a, 300b, 300c, or 300d) according to an embodiment, a size of a structure to be discarded when the semiconductor chip 120 is defective may be reduced. Therefore, a process of manufacturing units of the semiconductor package may be more efficiently practiced.

Alternatively, since the semiconductor package (300a, 300b, 300c, or 300d) may use a combined structure of the second redistribution structure 150 and the second semiconductor chip 120, verified in advance, the semiconductor package (300a, 300b, 300c, or 300d) may increase a value obtained by multiplying probability that each component (including the combined structure) is normal, and may increase probability that the semiconductor package (300a, 300b, 300c, or 300d) corresponding to the multiplied value is normal.

Figure 1B:
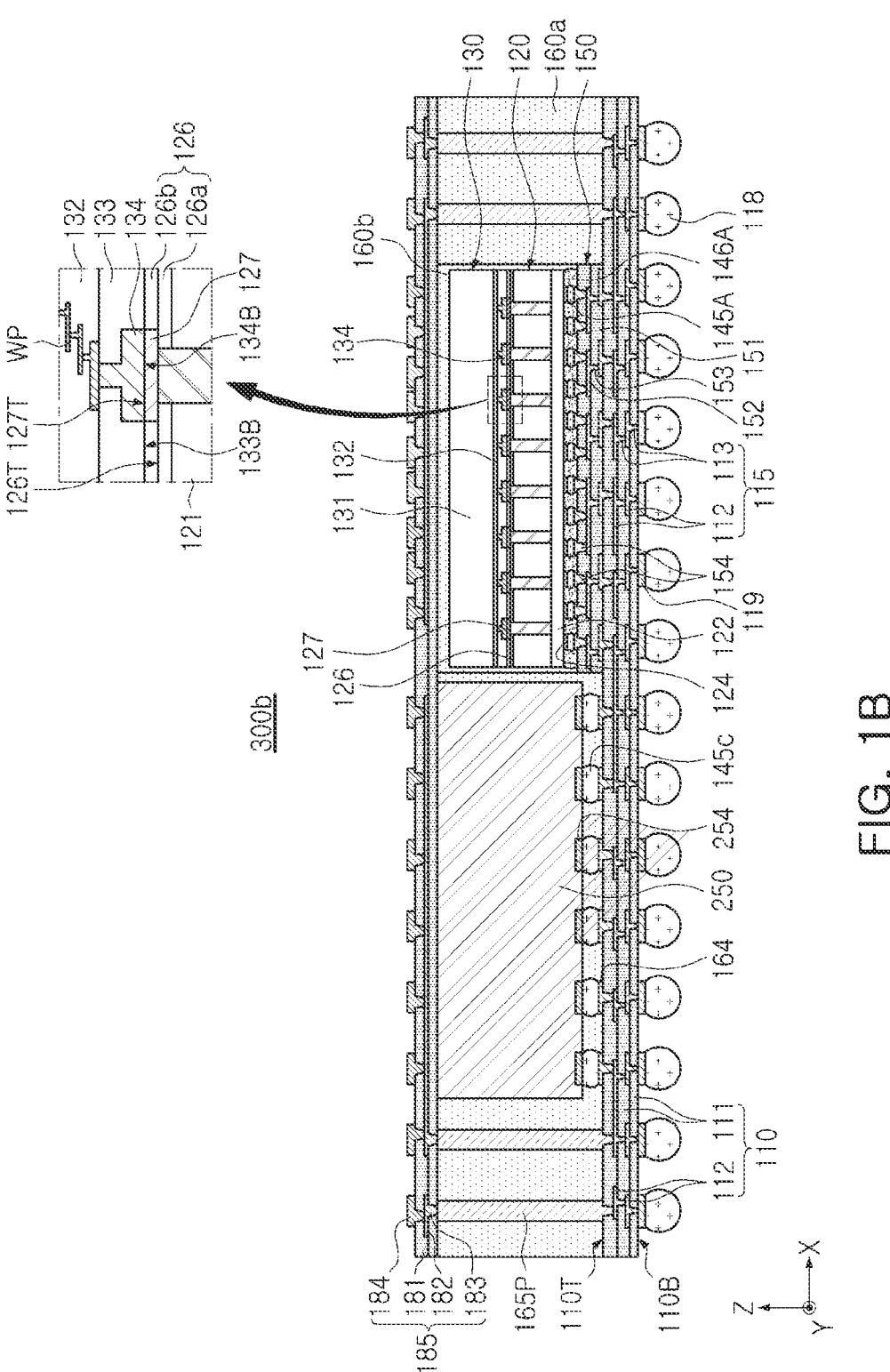
Figure 1C:
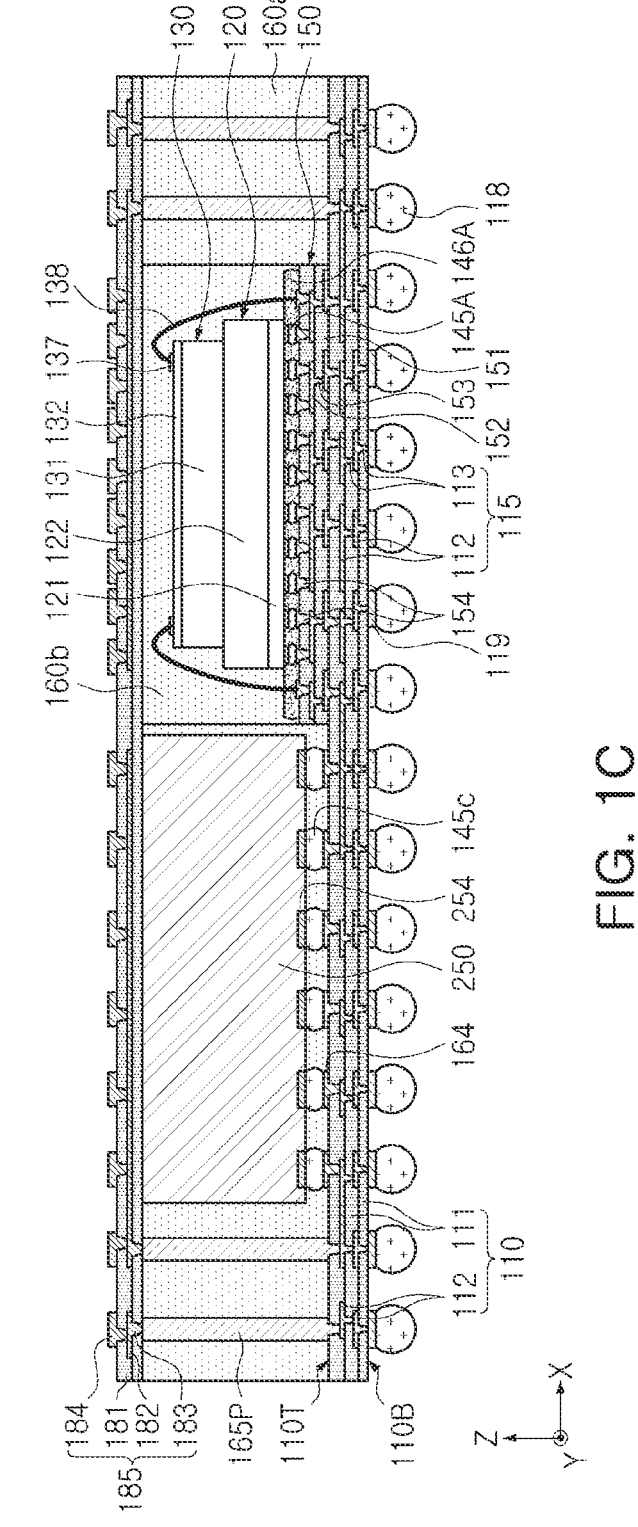

Referring to FIGS. 1A to 1C, a semiconductor package (300a, 300b, or 300c) according to an embodiment may include the first redistribution structure 110, the first semiconductor chip 250, the second semiconductor chip 120, a third semiconductor chip 130, the second redistribution structure 150, a first encapsulant 160a, and a second encapsulant 160b.

Each of the first, second, and third semiconductor chips 250, 120, and 130 may be disposed on the one surface 110T of the first redistribution structure. The third semiconductor chip 130 may be implemented in a similar manner to the first semiconductor chip 250 and the second semiconductor chip 120. For example, the third semiconductor chip 130 may include a body portion 131 implemented in a similar manner to the body portion 121, and a device layer 132 implemented in a similar manner to the device layer 122.

A horizontal size of a combined structure (3D integrated circuit structure) of the second semiconductor chip 120 and the third semiconductor chip 130 may be similar to a horizontal size of one semiconductor chip. A total volume (corresponding to circuit performance) of the device layers 122 and 132 of the second semiconductor chip 120 and the third semiconductor chip 130 may be about twice a volume of a device layer of one semiconductor chip. Therefore, a density of electrical connection paths to the first redistribution structure 110 of the combined structure of the second semiconductor chip 120 and the third semiconductor chip 130 may be higher than that of one semiconductor chip.

Therefore, since it may be difficult for the probes of the tester to directly verify the combined structure of the second semiconductor chip 120 and the third semiconductor chip 130, the combined structure of the second semiconductor chip 120 and the third semiconductor chip 130 may be verified through a lower surface of the second redistribution structure 150. A horizontal size of the second redistribution structure 150 may be greater than the horizontal size of the combined structure of the second semiconductor chip 120 and the third semiconductor chip 130, and it may be advantageous for the second redistribution layers 152, such as a pad, to have a structure in which a probe is easy to contact.

Therefore, a combined structure of the second semiconductor chip 120 and the third semiconductor chip 130 and the second redistribution structure 150 may be a sub-semiconductor package that may be verified in advance, and may be mounted in the semiconductor package (300a, 300b, or 300c), after being verified in advance. Therefore, probability that the semiconductor package (300a, 300b, or 300c) is normal may increase.

For example, assuming that a probability that each of the first semiconductor chip 250, the second semiconductor chip 120, and the third semiconductor chip 130 is normal, or free of defects, is about 90%, when the first semiconductor chip 250, the second semiconductor chip 120, and the third semiconductor chip 130 are embedded in a semiconductor package before being verified in advance, a probability that the semiconductor package is normal may be about 73%, and a probability that the semiconductor package will include a defect may be about 27%. When the second semiconductor chip 120 and the third semiconductor chip 130 are verified in advance, the probability that the semiconductor package is normal may increase to about 90%, and the probability that the semiconductor package will include a defect may decrease to about 10%. That is, a probability that the sub-semiconductor package includes a defect may be about 17%. In a case where the combined structure of the second semiconductor chip 120, the third semiconductor chip 130 and the second redistribution structure 150 includes a defect, the sub-semiconductor package may be discarded, without needing to discard the first semiconductor chip 250. Therefore, an average size of the discarded structure may be reduced, and the semiconductor package (300a, 300b, or 300c) according to an embodiment may be efficiently manufactured.

The first encapsulant 160a may be disposed on the one surface 110T of the first redistribution structure 110. The first encapsulant 160a may surround the first semiconductor chip 250, and may surround the second encapsulant 160b. The second encapsulant 160b may be disposed on one surface (e.g., an upper surface) of the second redistribution structure 150. The second encapsulant 160b may surround the second semiconductor chip 120, and may surround the third semiconductor chip 130.

For example, each of the first encapsulant 160a and the second encapsulant 160b may contain a molding material such as an epoxy molding compound (EMC). The material that may be contained in each of the first encapsulant 160a and the second encapsulant 160b is not limited to the molding material, and may contain an insulating material that may have protective properties similar to those of the molding material or high ductility. For example, the insulating material may be a build-up film (e.g., an Ajinomoto build-up film (ABF)), a thermosetting resin such as an epoxy resin, or a thermoplastic resin such as polyimide, and may be an insulating material in which an inorganic filler and/or a glass fiber is appropriately added to an insulating material of the first insulating layer 111.

A combined structure of the second semiconductor chip 120, the third semiconductor chip 130, the second redistribution structure 150, and the second encapsulant 160b may be a sub-semiconductor package that may be verified in advance, and may be mounted in the semiconductor package (300a, 300b, or 300c), after being verified in advance. Since the second encapsulant 160b may protect each of the second semiconductor chip 120 and the third semiconductor chip 130 from an external environment (e.g., a physical shock or a high temperature), in a process of embedding the sub-semiconductor package, verified in advance, into the semiconductor package (300a, 300b, or 300c), it may be possible to prevent additional defects from occurring.

Since the first encapsulant 160a may be formed after disposing the combined structure of the second semiconductor chip 120, the third semiconductor chip 130, the second redistribution structure 150, and the second encapsulant 160b, the first encapsulant 160a may be formed later than the second encapsulant 160b. Therefore, a boundary surface between the first encapsulant 160a and the second encapsulant 160b may be formed based on a difference in formation time between the first encapsulant 160a and the second encapsulant 160b. Alternatively, depending on a design, the boundary surface between the first encapsulant 160a and the second encapsulant 160b may be formed based on the fact that the first encapsulant 160a and the second encapsulant 160b may contain different materials.

Referring to FIGS. 1A to 1D, a semiconductor package (300a, 300b, 300c, or 300d) according to an embodiment may further include bumps 118 and UBMs 119.

The bumps 118 disposed on a different surface 110B of the first redistribution structure 110 and electrically connected to at least one of the first semiconductor chip 250 and the second semiconductor chip 120 may be further included. For example, the bumps 118 may have a ball shape or a column shape. The bumps 118 may include a solder containing tin (Sn) or an alloy (Sn—Ag—Cu) containing tin (Sn). Since the bumps 118 may have a relatively low melting point, compared to other metal materials, the bumps 118 may be connected and attached to the UBMs 119 of the semiconductor package (100a, 100b, 100c, or 100d) by a thermal compression bonding (TCB) process or a reflow process.

The one surface 110T of the first redistribution structure 110 may be a top surface of the first redistribution structure 110 and the different surface 110B of the first redistribution structure 110 may be a bottom surface of the first redistribution structure 110. The one surface 110T and the different surface 110B may be opposite surfaces of the first redistribution structure 110.

The UBMs 119 may be disposed on the different surface 110B of the first redistribution structure 110, first UBMs 164 may be disposed on the one surface 110T of the first redistribution structure 110, and second UBMs 154 may be disposed on one surface (e.g., an upper surface) of the second redistribution structure 150. For example, each of the UBMs 119, the first UBMs 164, and the second UBMs 154 may have a width, wider than a line width of a redistribution layer. Each of the UBMs 119, the first UBMs 164, and the second UBMs 154 may be a pad. Each of the UBMs 119, the first UBMs 164, and the second UBMs 154 may have upper/lower surfaces having a shape, similar to a circular shape, and may be coupled to a via and formed by a semi additive process (SAP).

There may be no bump between the first redistribution structure 110 and the second redistribution structure 150. For example, the first redistribution layer 112 or the first insulating layer 111 of the first redistribution structure 110 may be in contact with the second redistribution layer 152 or the second insulating layer 151 of the second redistribution structure 150. The bump may contain a metal material having a relatively low melting point, compared to other metal materials. The bump may have a shape, similar to a sphere, and may refer to a structure capable of physically coupling a plurality of structures implemented separately from each other while electrically connecting the same to each other.

Therefore, additional defects (e.g., an electrical short between bumps, a disconnection of some of the bumps, or the like) may be prevented in a process of embedding the sub-semiconductor package, verified in advance, into the semiconductor package (300a, 300b, or 300c).

Referring to FIG. 1A, a semiconductor package 300a according to an embodiment may further include at least one of a first bump 145C, a second bump 145A, a third bump 145B, a first non-conductive film layer 146A, or a second non-conductive film layer 146B.

The first bump 145C may electrically connect a first redistribution structure 110 and a first semiconductor chip 250. The second bump 145A may electrically connect a second redistribution structure 150 and the first semiconductor chip 250. The third bump 145B may electrically connect a second semiconductor chip 120 and a third semiconductor chip 130. Each of the first bump 145C, the second bump 145A, and the third bump 145B may be implemented in a similar manner to bumps 118, but may be smaller than each of the bumps 118.

For example, the second semiconductor chip 120 may further include through-vias 125, a first intermediate dielectric layer 126, and first connection pads 127. The first connection pads 127 and the first intermediate dielectric layer 126 may be disposed on an upper surface of the second semiconductor chip 120, and third bumps 145B may be in contact with and disposed between the first connection pads 127 and second connection pads 134. The through-vias 125 may pass through the body portion 121, and may be electrically connected between the device layer 122 and the first connection pads 127. The through-vias 125 may be formed of a conductive material, and may include, for example, at least one of tungsten (W), aluminum (Al), or copper (Cu).

For example, the second semiconductor chip 120 may include connection pads 124 disposed on a lower surface of the second semiconductor chip 120. The second semiconductor chip 120 may be mounted on the upper surface of the second redistribution structure 150 through the connection pads 124 and the second bumps 145A. Therefore, the second semiconductor chip 120 may be electrically connected to the at least one second redistribution layer 152.

The first non-conductive film layer 146A may surround the second bumps 145A, and the second non-conductive film layer 146B may surround the third bump 145B. For example, the first non-conductive film layer 146A and the second non-conductive film layer 146B may be referred to as underfill layers, may include a non-conductive polymer, and may include a non-conductive paste (NCP).

Referring to FIG. 1B, in a semiconductor package 300b according to an embodiment, a second semiconductor chip 120 may include a first connection pad 127 disposed on a surface (e.g., an upper surface) facing a third semiconductor chip 130, and a first intermediate dielectric layer 126 surrounding the first connection pad 127. The third semiconductor chip 130 may include a second connection pad 134 disposed on a surface (e.g., a lower surface) facing the second semiconductor chip 120, and a second intermediate dielectric layer 133 surrounding the second connection pad 134.

The first connection pad 127 and second connection pad 134 may be in contact with each other, and the first intermediate dielectric layer 126 and the second intermediate dielectric layer 133 may be in contact with each other. Therefore, the first connection pad 127 and the second connection pad 134 may be covered by the first intermediate dielectric layer 126 and the second intermediate dielectric layer 133, and may not be exposed through a second encapsulant 160b. This structure may be expressed as hybrid bonding. For example, each of the first intermediate dielectric layer 126 and the second intermediate dielectric layer 133 may contain at least one of silicon oxide (SiO), silicon nitride (SiN), or silicon carbonitride (SiCN).

For example, before the second semiconductor chip 120 and the third semiconductor chip 130 are coupled, the first intermediate dielectric layer 126 may be disposed on the second semiconductor chip 120 and the second intermediate dielectric layer 133 may be disposed on the third semiconductor chip 130. Thereafter, the second semiconductor chip 120 and the third semiconductor chip 130 may be joined to each other through a boundary surface 133B of the first intermediate dielectric layer 126 and the second intermediate dielectric layer 133. In this case, the first connection pads 127 having a top boundary surface 127T and the second connection pads 134 having a bottom boundary surfaces 134B may be joined to each other through these boundary surfaces.

For example, the first intermediate dielectric layer 126 may include a plurality of intermediate dielectric layers 126a and 126b, and the plurality of intermediate dielectric layers 126a and 126b may be joined to each other through a boundary surface 126T. Upper surfaces of through-vias 125 and the boundary surface 126T may form one plane. The second connection pads 134 may be connected to an interconnection pattern WP of a device layer 132.

Referring to FIG. 1C, a semiconductor package 300c according to an embodiment may further include a wire 138. The wire 138 may bypass a second semiconductor chip 120 and electrically connect a surface (e.g., an upper surface) of a third semiconductor chip 130 facing a third redistribution structure 185 and a second redistribution structure 150. This structure may be referred to as a wire bonding.

For example, the wire 138 may contain a metal material having high conductivity, such as gold (Au), aluminum (Al), or copper (Cu), and may be connected to third connection pads 137 of the third semiconductor chip 130.

Figure 1D:
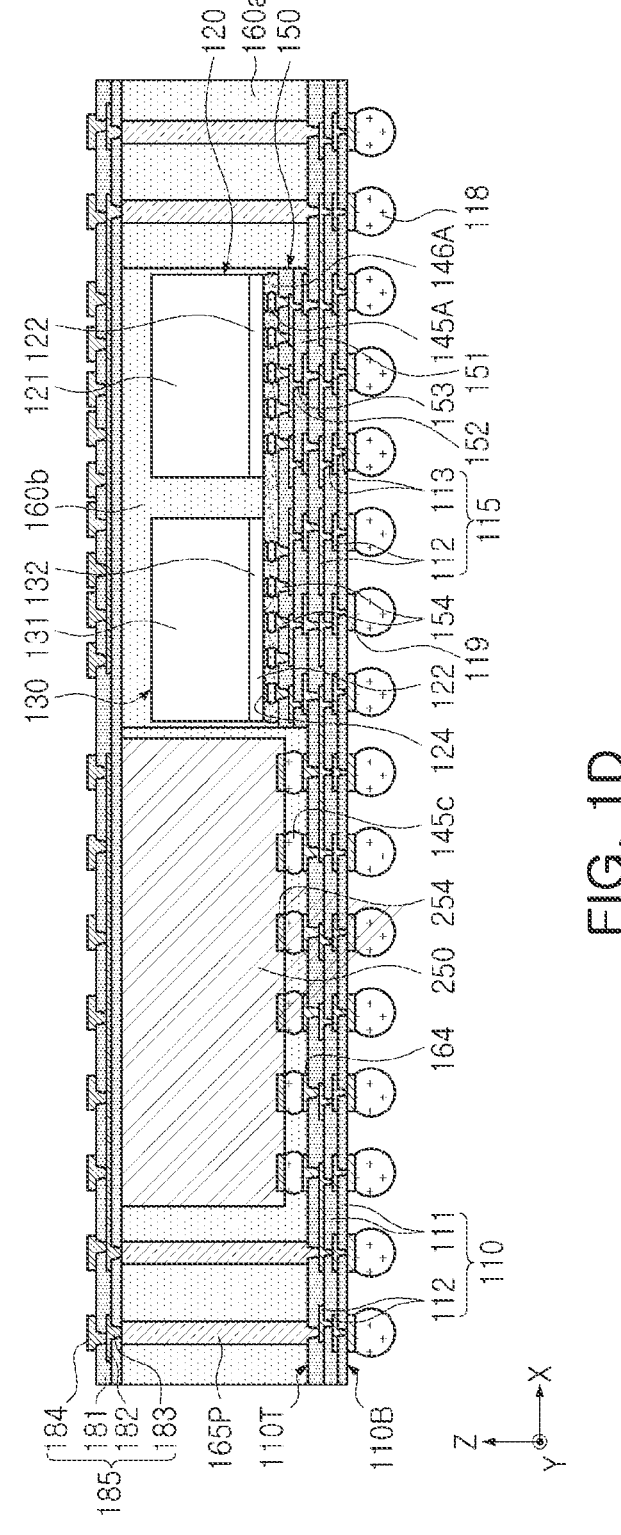
Figure 2A:
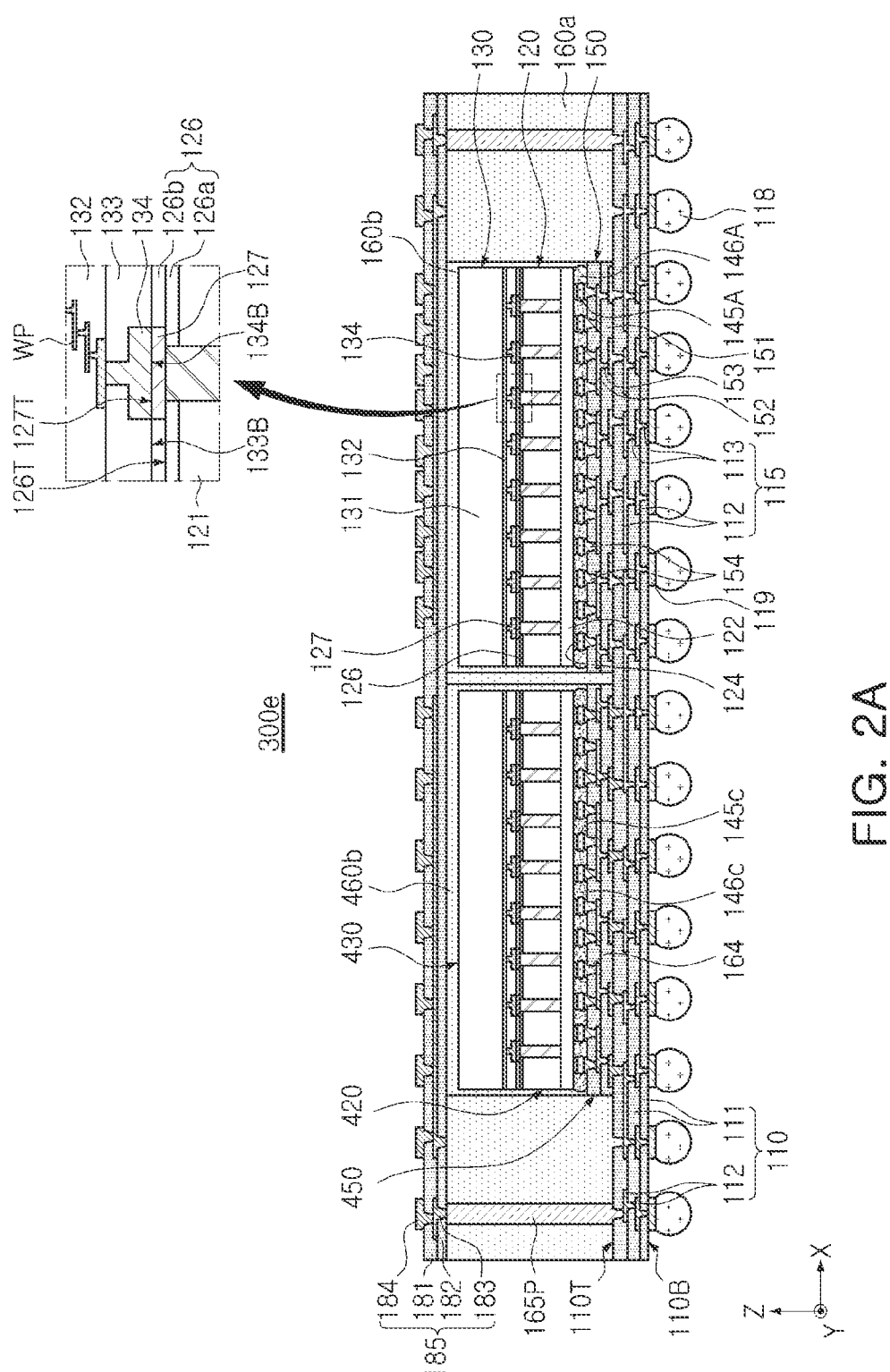
FIG. 2A, FIG. 2B, FIG. 2C, and FIG. 2D are cross-sectional views illustrating a structure in which a semiconductor package according to an embodiment further includes a fourth semiconductor chip and a fourth redistribution structure.
Figure 2B:
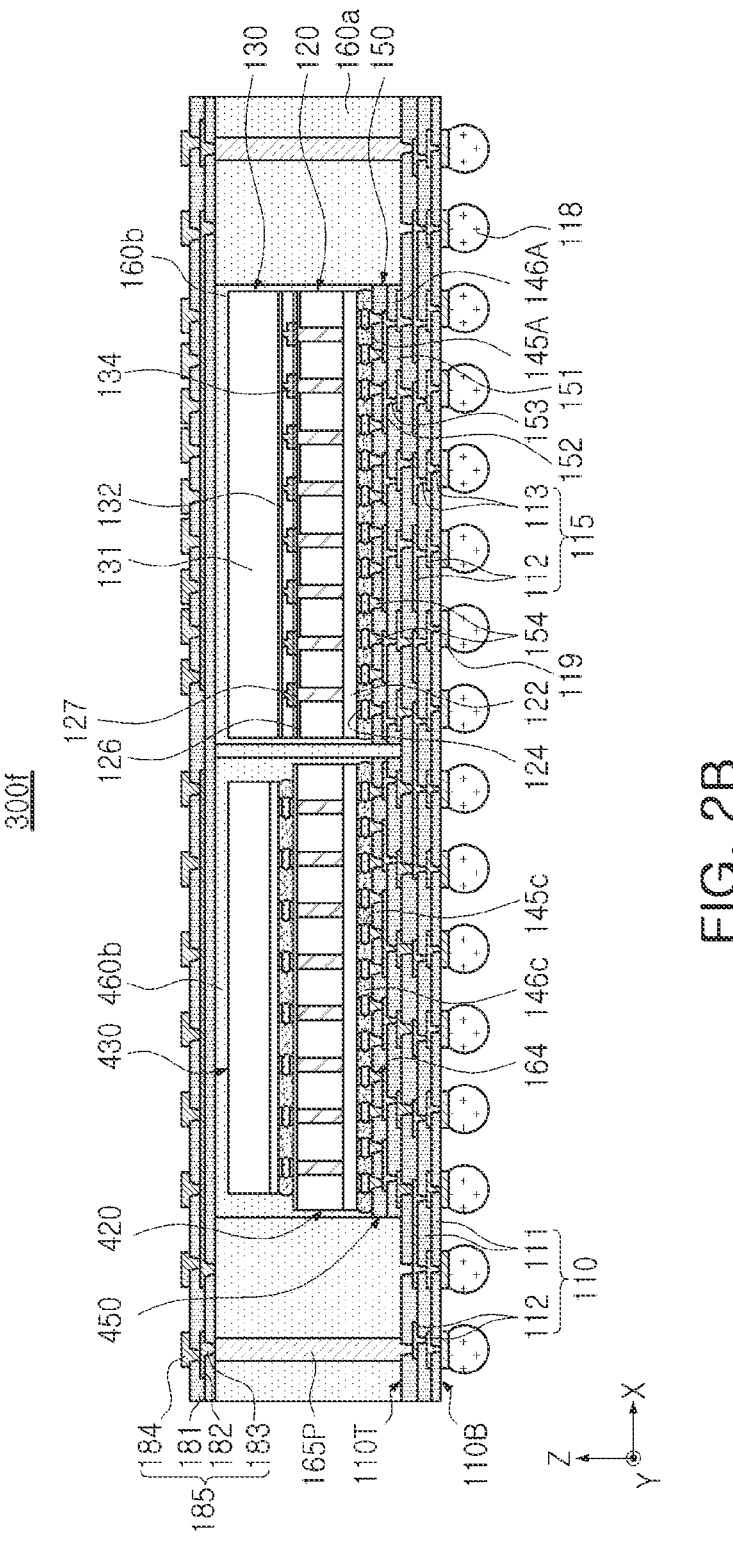
Figure 2C:
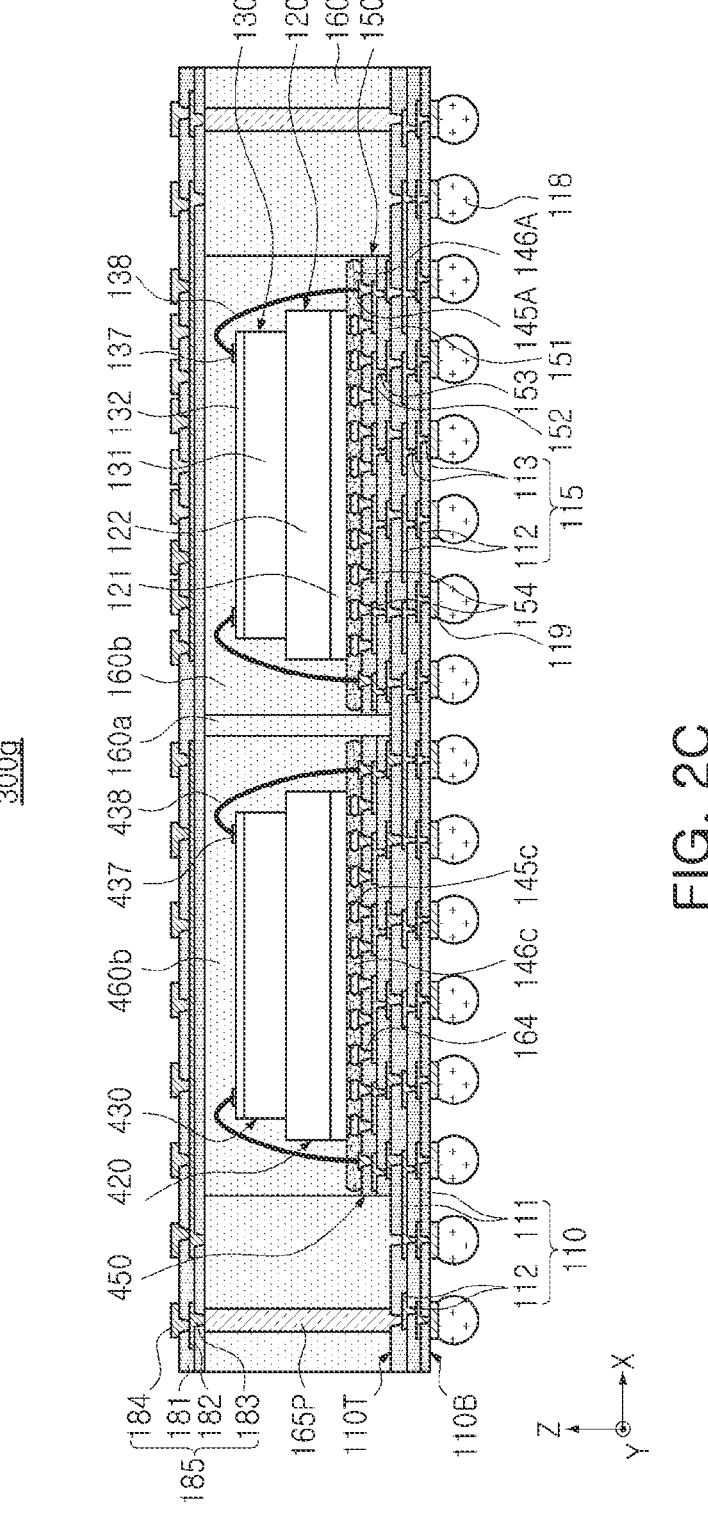
Figure 2D:
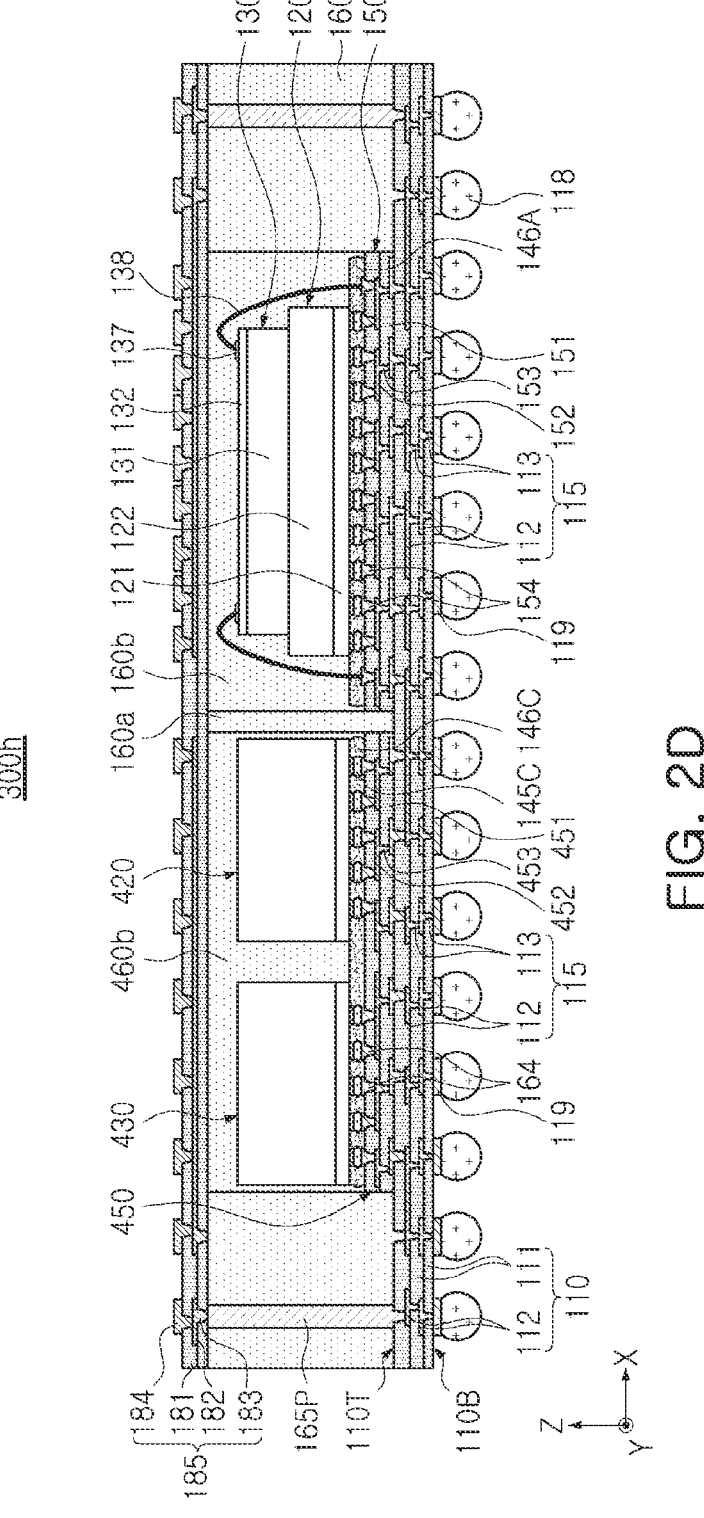

Referring to FIG. 1D, in a semiconductor package 300d according to an embodiment, the second semiconductor chip 120 and the third semiconductor chip 130 on a second redistribution structure 150 may be not to overlap each other in a vertical direction. This structure may be used, for example, when a thickness of a first semiconductor chip 250 is relatively thin.

Referring to FIG. 2A, FIG. 2B, FIG. 2C, and FIG. 2D, a semiconductor package (300e, 300f, 300g, or 300h) according to some embodiments may further include at least one of a fourth redistribution structure 450, a fourth semiconductor chip 430, or a third encapsulant 460b. A first semiconductor chip 420, the second semiconductor chip 120, the third semiconductor chips 130, and the fourth semiconductor chip 430 may be disposed between the first redistribution structure 110 and the third redistribution structure 185, and may be thus mounted in the semiconductor package (300e, 300f, 300g, or 300h).

The fourth redistribution structure 450 may be disposed between the first semiconductor chip 420 and the first redistribution structure 110. The fourth redistribution structure 450 may have a structure in which at least one fourth redistribution layer and at least one fourth insulating layer are alternately stacked, and may further include fourth vias vertically connecting the fourth redistribution layer. Since the fourth redistribution structure 450 may be implemented in a similar manner to a second redistribution structure 150, the fourth redistribution layer may be implemented in a similar manner to second redistribution layers 152, the third insulating layer may be implemented in a similar manner to second insulating layer 151, and the fourth vias may be implemented in a similar manner to second vias 153.

The second semiconductor chip 120 and the third semiconductor chip 130 may not overlap the fourth redistribution structure 450 in the vertical direction. A combined structure of the fourth redistribution structure 450 and the first semiconductor chip 420 may be a sub-semiconductor package that may be verified in advance. For example, the combined structure of the fourth redistribution structure 450 and the first semiconductor chip 420 may be verified before being embedded in the semiconductor package (300e, 300f, 300g, or 300h). For example, the sub-semiconductor package may be verified using probes of a tester, which may be moved into contact with a position electrically connected to the fourth redistribution layers on a lower surface of the fourth redistribution structure 450. The tester may be used to verify whether the combined structure of the fourth redistribution structure 450 and the first semiconductor chip 420 is defective using resistance values measured by the tester. When the combined structure of the fourth redistribution structure 450 and the first semiconductor chip 420 includes a defect, the combined structure may be discarded.

Compared to a structure in which the first semiconductor chip 420 may be disposed to directly contact the first redistribution structure 110, in the semiconductor package (300e, 300f, 300g, or 300h), a size of a structure to be discarded when the first semiconductor chip 420 includes a defect may be reduced. Therefore, the semiconductor package may be manufactured more efficiently. Since the semiconductor package (300e, 300f, 300g, or 300h) may use a combined structure of the fourth redistribution structure 450 and the first semiconductor chip 420, verified in advance, the semiconductor package (300e, 300f, 300g, or 300h) may be manufactured more economically, at least since a probability that the semiconductor package (300e, 300f, 300g, or 300h) is normal may be increased. The probability that the semiconductor package (300e, 300f, 300g, or 300h) is normal may be improved by verifying the combined structure of the fourth redistribution structure 450 and the first semiconductor chip 420 in advance, where the probability that the semiconductor package (300e, 300f, 300g, or 300h) is normal may be obtained by multiplying a probability that each component (including the combined structure) is normal, and it can be ensured in advance that the combined structure is normal.

The fourth semiconductor chip 430 may be disposed between the first semiconductor chip 420 and the third redistribution structure 185, and the first semiconductor chip 420 and the fourth semiconductor chip 430 may overlap each other in a direction (e.g., the vertical direction) in which the first redistribution structure 110 and the third redistribution structure 185 face each other. The fourth semiconductor chip 430 may be implemented in a similar manner to the third semiconductor chip 130.

A combined structure of the first semiconductor chip 420, the fourth semiconductor chip 430 and the fourth redistribution structure 450 may be a sub-semiconductor package that may be verified in advance, and may be mounted in the semiconductor package (300e, 300f, 300g, or 300h), after being verified. Therefore, probability that the semiconductor package (300e, 300f, 300g, or 300h) is normal may be increased.

There may be no bump between the first redistribution structure 110 and the fourth redistribution structure 450. For example, the first redistribution structure 110 and the fourth redistribution structure 450 may be in contact with each other. The fourth redistribution structure 450 may be formed directly on the first redistribution structure 110. Therefore, additional defects (e.g., an electrical short between bumps, a disconnection of some of the bumps, or the like) may be prevented in a process of embedding the sub-semiconductor package, verified in advance, into the semiconductor package (300e, 300f, 300g, or 300h).

A third encapsulant 460b may be on one surface 110T of the first redistribution structure 110. The third encapsulant 460b may surround the first semiconductor chip 420, may surround the fourth semiconductor chip 430, and may be surrounded by a first encapsulant 160a. The third encapsulant 460b may be implemented in a similar manner to a second encapsulant 160b, and may be formed later than the first encapsulant 160a. Therefore, a boundary surface between the first encapsulant 160a and the third encapsulant 460b may be formed based on a difference in formation time between the first encapsulant 160a and the third encapsulant 460b. Alternatively, depending on a design, the boundary surface between the first encapsulant 160a and the third encapsulant 460b may be formed based on the fact that the first encapsulant 160a and the third encapsulant 460b contain different materials.

A combined structure of the first semiconductor chip 420, the fourth semiconductor chip 430, the fourth redistribution structure 450, and the third encapsulant 460b may be a sub-semiconductor package that may be verified in advance, and may be mounted in the semiconductor package (300e, 300f, 300g, or 300h), after being verified. Since the third encapsulant 460b may protect each of the first semiconductor chip 420 and the fourth semiconductor chip 430 from an external environment (e.g., a physical shock or a high temperature), in a process of embedding the sub-semiconductor package, verified in advance, into the semiconductor package (300e, 300f, 300g, or 300h), it is possible to prevent additional defects from occurring.

Figure 3A:
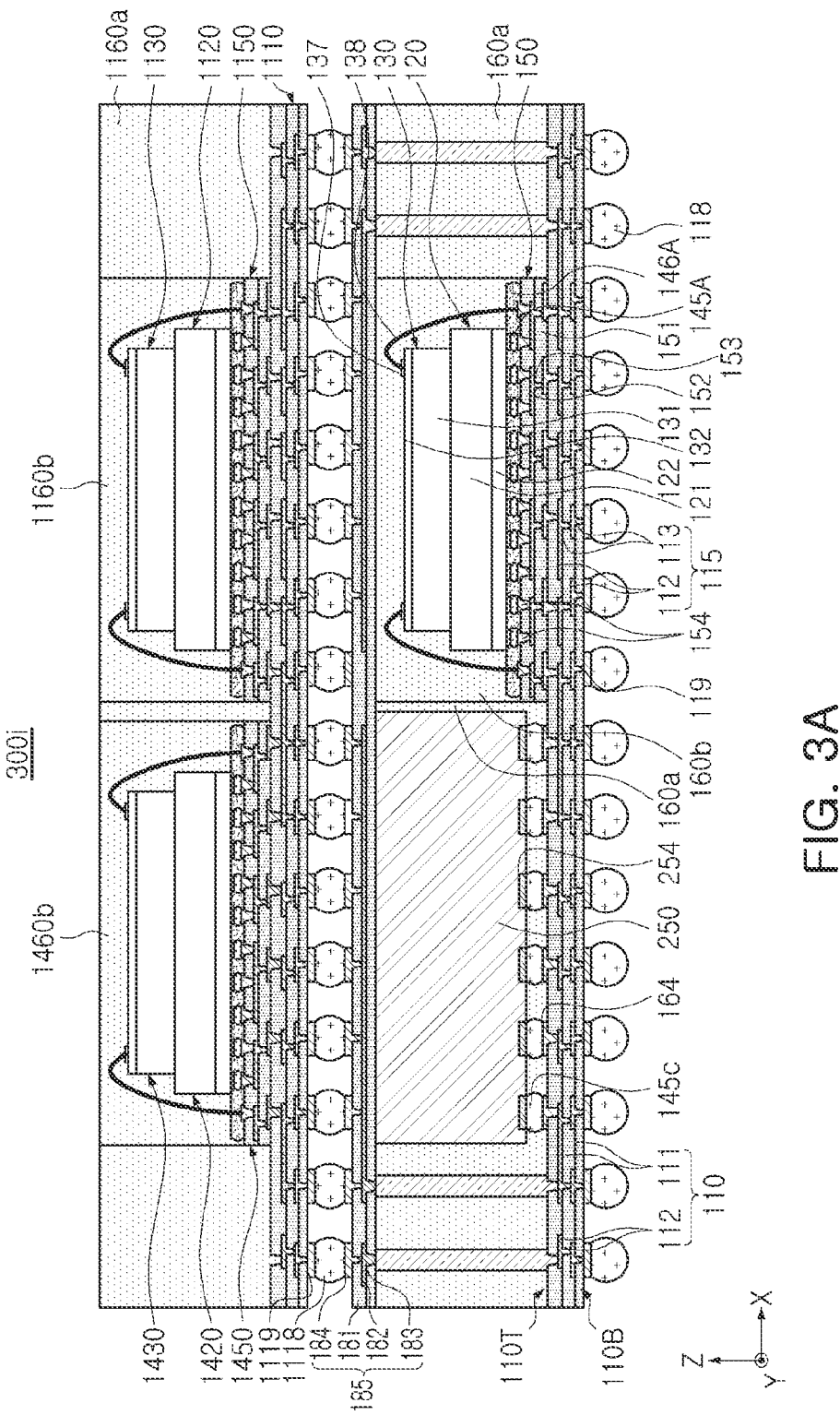
FIG. 3A, FIG. 3B, and FIG. 3C are cross-sectional views illustrating a package-on-package (PoP) structure of a semiconductor package according to an embodiment.
Figure 3B:
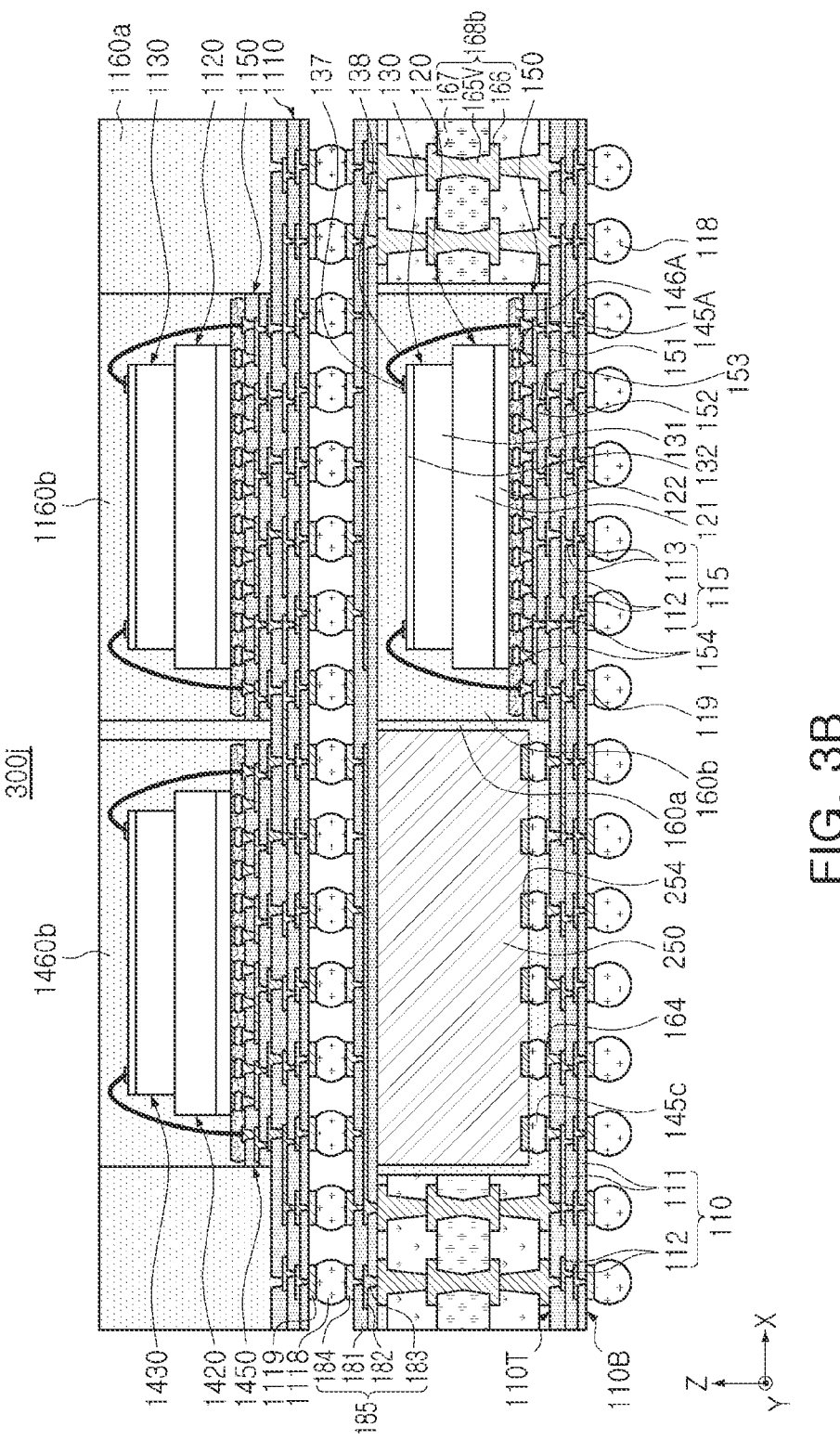
Figure 3C:
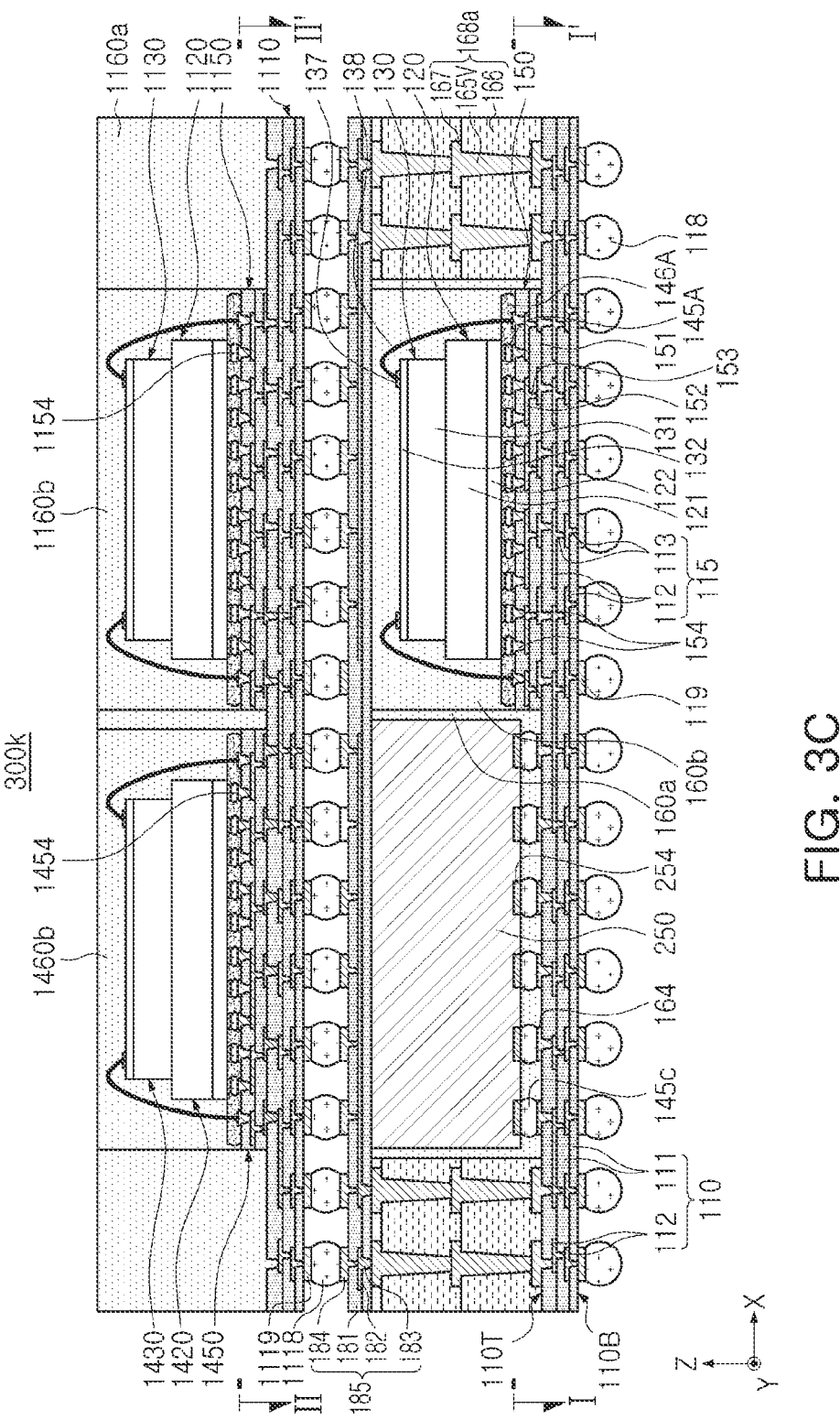

Referring to FIG. 3A, FIG. 3B, and FIG. 3C, a semiconductor package (300i, 300j, or 300k) according to some embodiments may further include at least one of a fifth redistribution structure 1110, a package-on-package (PoP) bump 1118, a PoP UBM 1119, a sixth semiconductor chip 1120, a seventh semiconductor chip 1130, a sixth redistribution structure 1150, a fourth encapsulant 1160a, a fifth encapsulant 1160b, a fifth semiconductor chip 1420, an eighth semiconductor chip 1430, a seventh redistribution structure 1450, or a sixth encapsulant 1460b, and may thus be a package-on-package (POP) structure.

The fifth semiconductor chip 1420, the sixth semiconductor chip 1120, the seventh semiconductor chip 1130, and the eighth semiconductor chip 1430 may be disposed on an upper surface of a third redistribution structure 185 and an upper surface of the fifth redistribution structure 1110, and may be implemented in a similar manner to the first semiconductor chip 420, the second semiconductor chip 120, the third semiconductor chip 130, and the fourth semiconductor chip 430.

The fifth redistribution structure 1110 may electrically connect the fifth semiconductor chip 1420 and the third redistribution structure 185. The fifth redistribution structure 1110 have a structure in which at least one fifth redistribution layer and at least one fifth insulating layer are alternately stacked, and may be implemented in a similar manner to the first redistribution structure 110 and the third redistribution structure 185.

The PoP bump 1118 and the PoP UBM 1119 may electrically connect the third redistribution structure 185 and the fifth redistribution structure 1110. The PoP bump 1118 and the PoP UBM 1119 may be implemented in a similar manner to bumps 118 and UBM 119.

The sixth redistribution structure 1150 may be disposed between the sixth semiconductor chip 1120 and the fifth redistribution structure 1110. The sixth redistribution structure 1150 have a structure in which at least one sixth redistribution layer and at least one sixth insulating layer are alternately stacked, and may be implemented in a similar manner to a second redistribution structure 150. The fifth semiconductor chip 1420 and the eighth semiconductor chip 1430 may not overlap the sixth redistribution structure 1150 in a direction (e.g., the Z-direction) in which the fifth redistribution structure 1110 and the sixth redistribution structure 1150 face each other.

The seventh redistribution structure 1450 may be disposed between the fifth semiconductor chip 1420 and the fifth redistribution structure 1110. The seventh redistribution structure 1450 may have a structure in which at least one seventh redistribution layer and at least one seventh insulating layer are alternately stacked, and may be implemented in a similar manner to a fourth redistribution structure 450. The sixth semiconductor chip 1120 and the seventh semiconductor chip 1130 may not overlap the seventh redistribution structure 1450 in a direction (e.g., the Z-direction) in which the fifth redistribution structure 1110 and the sixth redistribution structure 1150 face each other.

Referring to FIG. 3B and FIG. 3C, a semiconductor package (300j or 300k) according to some embodiments may include core members 168a and 168b, and the core members 168a and 168b may include at least one of a conductive core via 165V, a core insulating layer 166, and a core interconnection layer 167, and may be formed by a panel level package (PLP) method.

The core insulating layer 166 may be disposed between the first redistribution structure 110 and the third redistribution structure 185. The core insulating layer 166 may surround the first semiconductor chip 250 and the second semiconductor chip 120. The core insulating layer 166 may reduce a possibility of warpage of the semiconductor package (300j or 300k). For example, the core insulating layer 166 may include an insulating material, similar to an insulating material of a core disposed in a central portion of a printed circuit board, and may have a stronger rigidity and may be thicker than first to seventh insulating layers included in first to seventh redistribution structures, respectively. For example, the core insulating layer 166 may be formed by removing a portion of a copper clad laminate (CCL) (a space in which a semiconductor chip is disposed, and implemented as a cavity).

The conductive core via 165V may vertically pass through the core insulating layer 166. The conductive core via 165V may be electrically connected to the first redistribution structure 110 and the third redistribution structure 185. The core interconnection layer 167 may be vertically connected to the conductive core via 165V. For example, the conductive core via 165V and the core interconnection layer 167 may be implemented in a similar manner to a conductive structure (e.g., an interconnection, a via, or the like) of the printed circuit board.

Figure 4A:
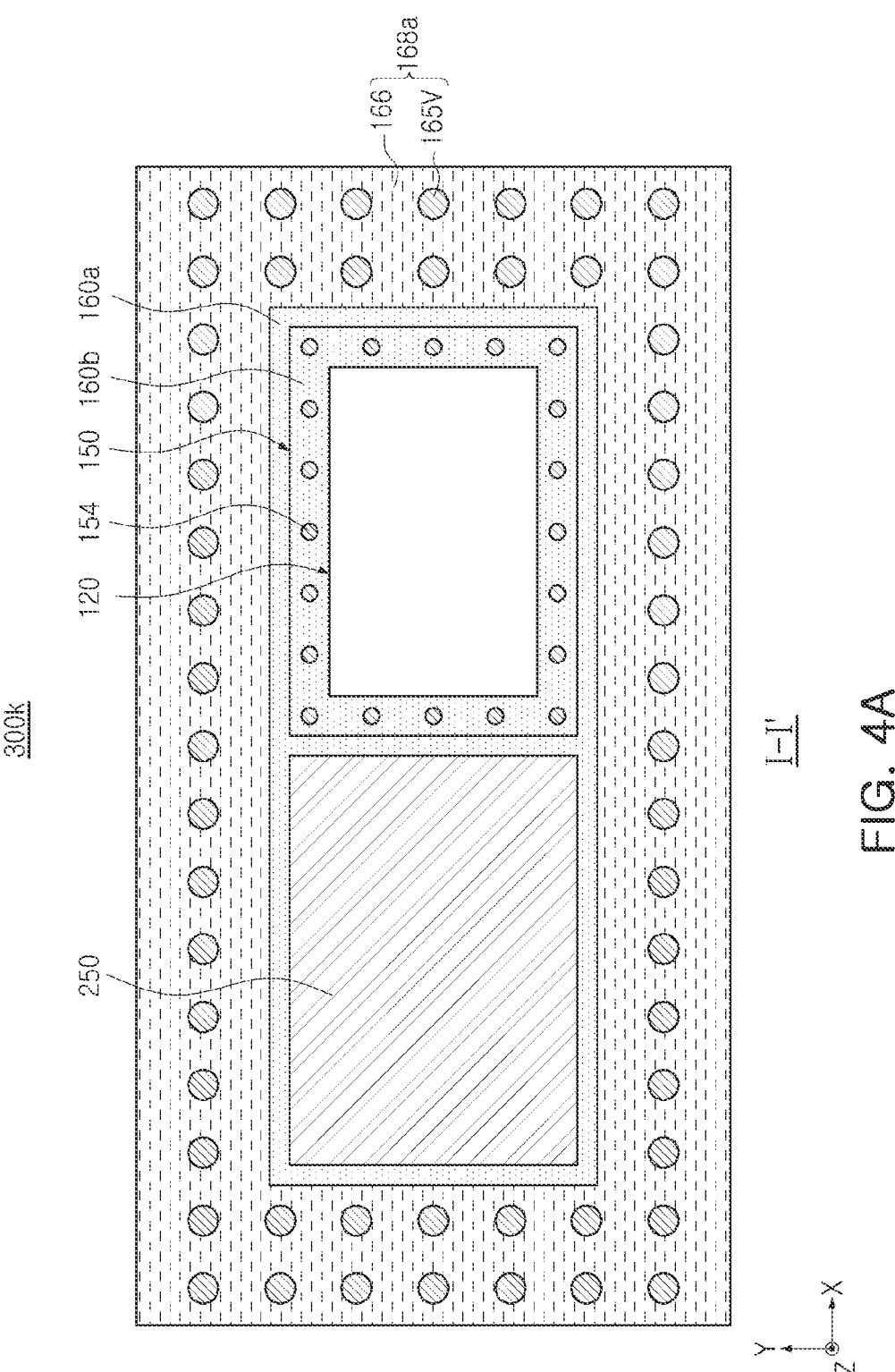
FIG. 4A and FIG. 4B are plan views illustrating a cross-section of a semiconductor package according to an embodiment, taken along an X-Y plane.

Referring to FIG. 3C and FIG. 4A, a first plane I-I' of a semiconductor package 300k according to an embodiment may include a structure in which a core insulating layer 166 surrounds a first semiconductor chip 250, a second semiconductor chip 120, a first encapsulant 160a, a second encapsulant 160b, and a second redistribution structure 150. The semiconductor package 300k may include a structure in which the first encapsulant 160a surrounds the semiconductor chip 120, the second encapsulant 160b, and the second redistribution structure 150. The semiconductor package 300k may include a structure in which the second encapsulant 160b surrounds the second semiconductor chip 120.

Figure 4B:
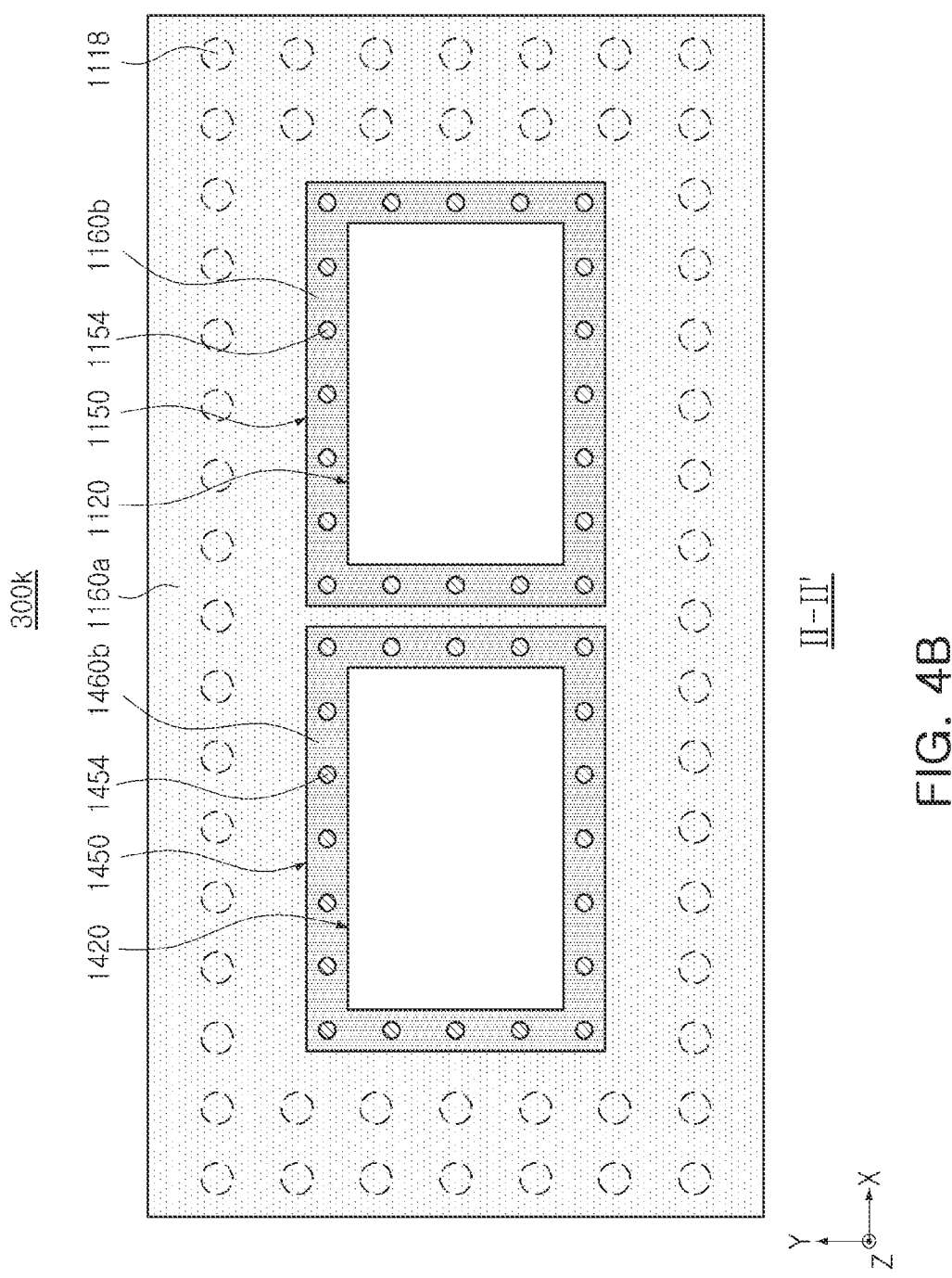
Figure 5A:
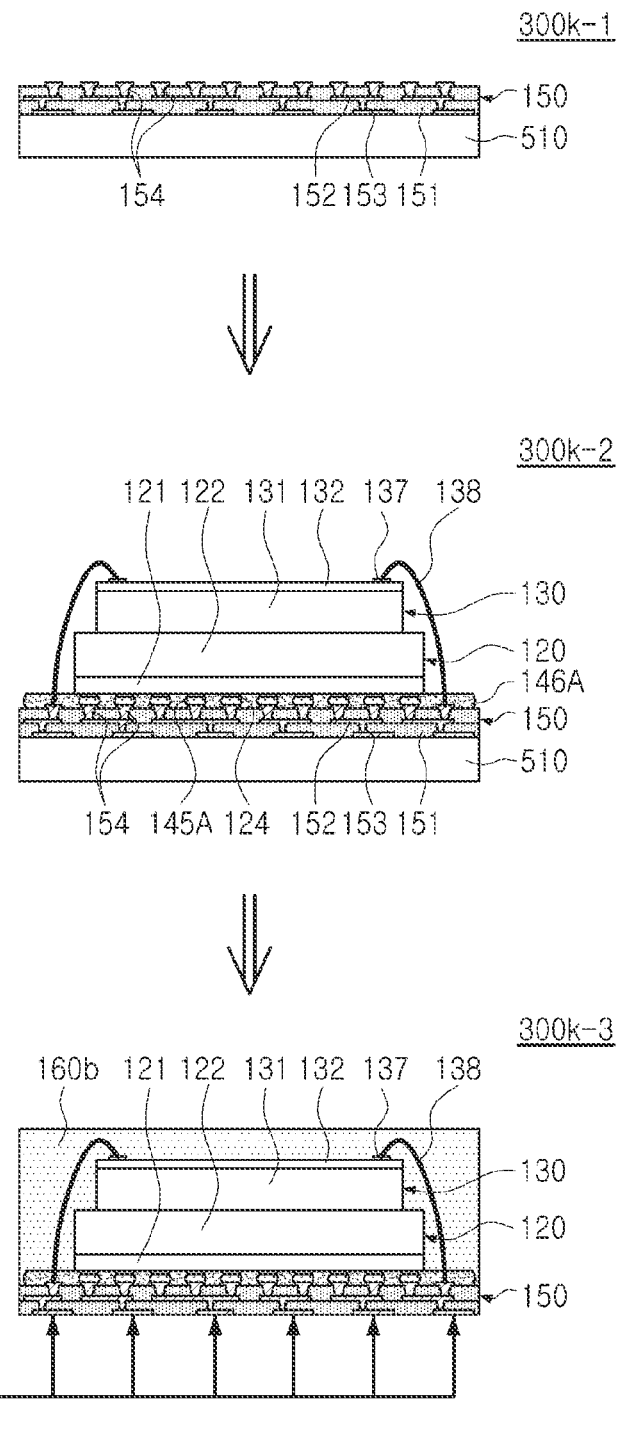
FIG. 5A, FIG. 5B, FIG. 5C, FIG. 5D, FIG. 5E and FIG. 5F are cross-sectional views illustrating a method of manufacturing a semiconductor package according to an embodiment.
Figure 5B:
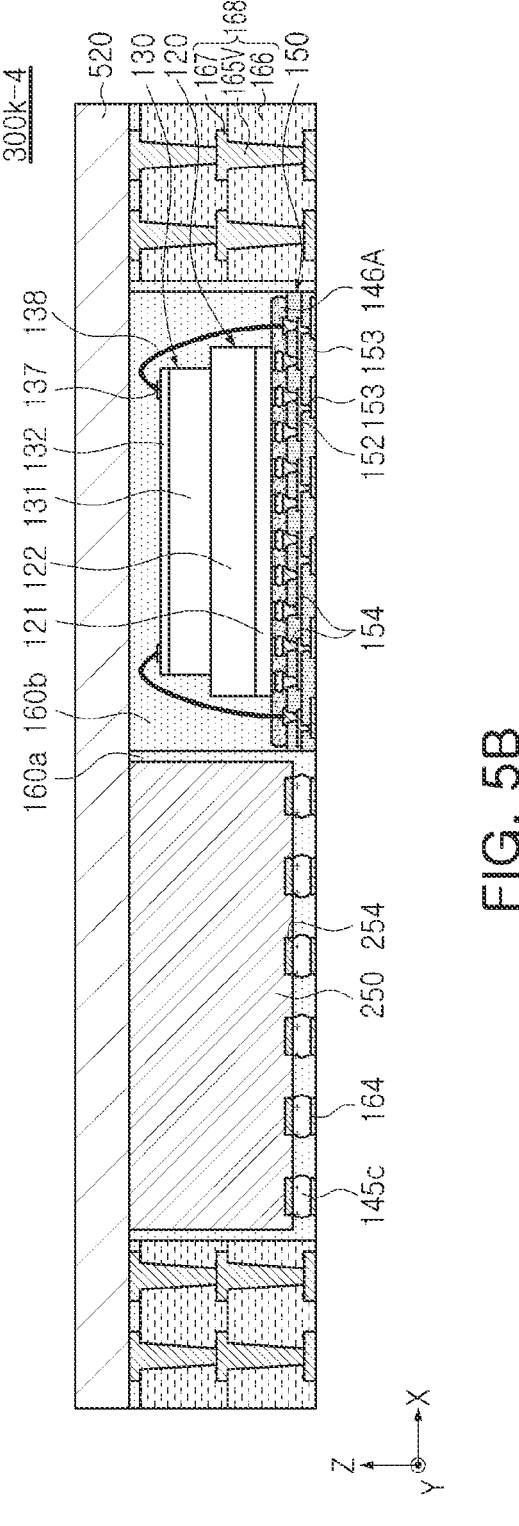
Figure 5C:
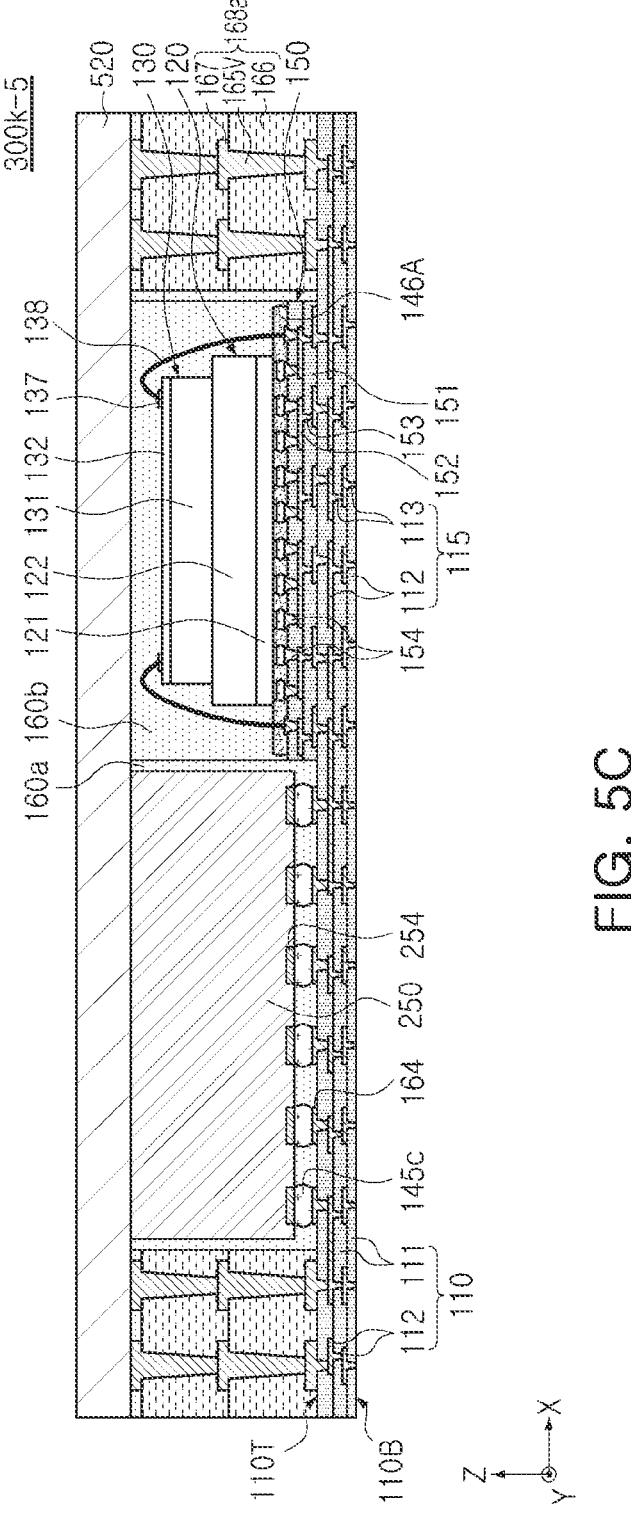
Figure 5D:
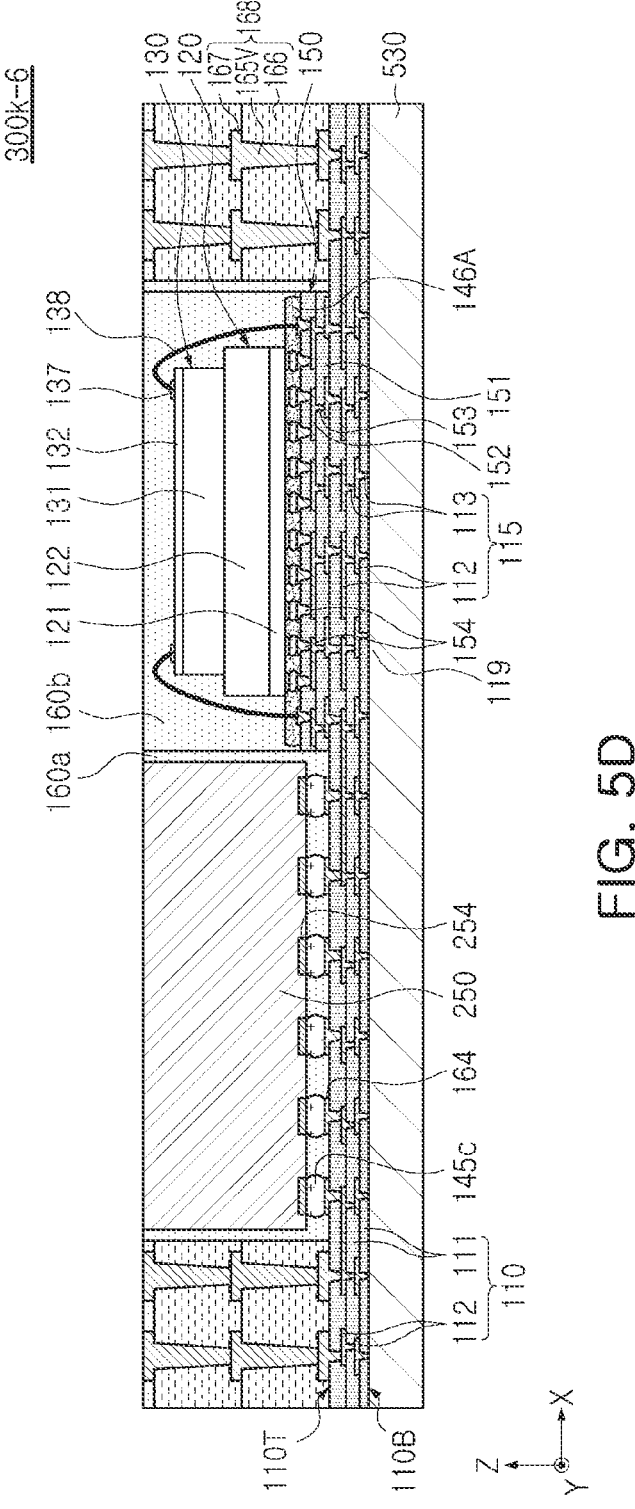
Figure 5E:
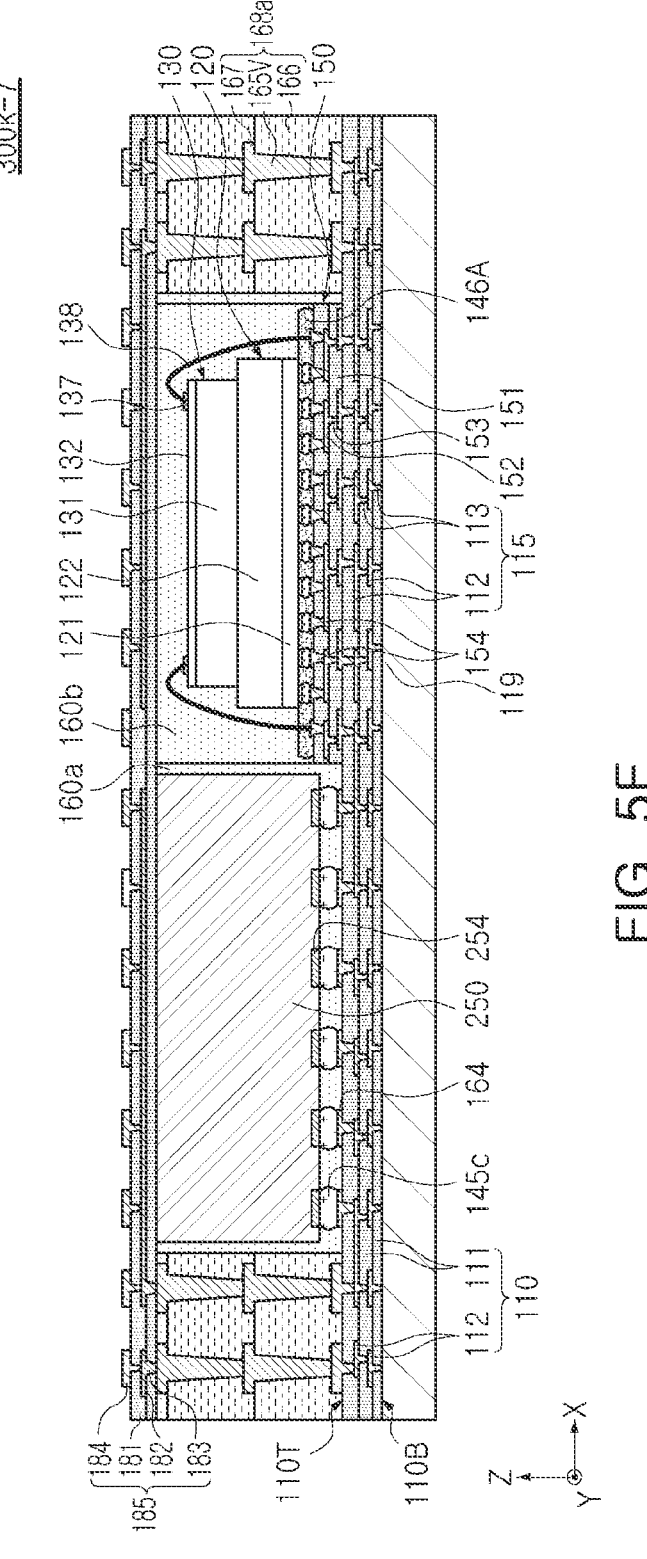
Figure 5F:
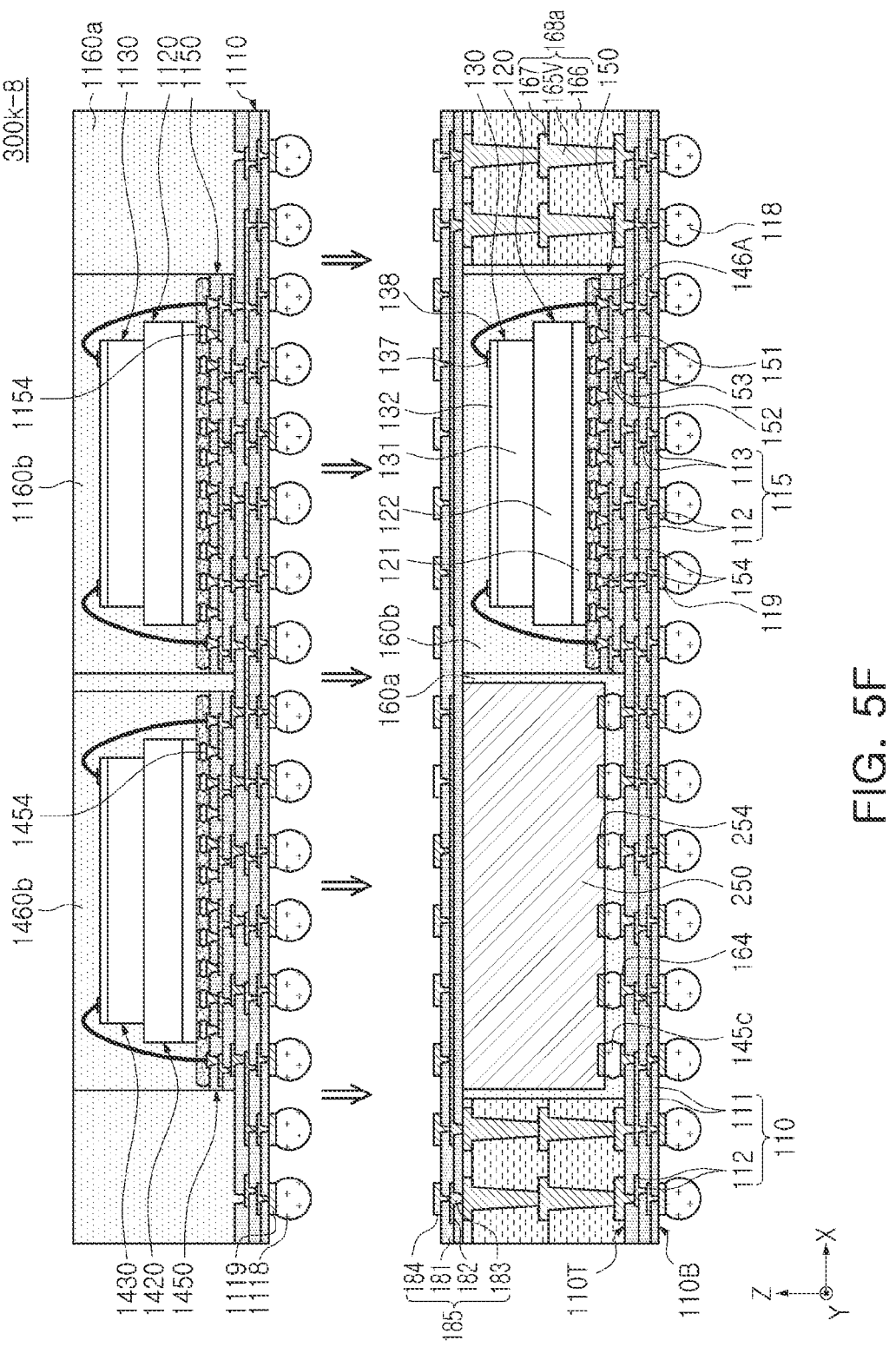

Referring to FIG. 3C and FIG. 4B, a second plane II-IF of a semiconductor package 300k according to an embodiment may include a structure in which a fourth encapsulant 1160a surrounds a fifth semiconductor chip 1420, a sixth semiconductor chip 1120, a fifth encapsulant 1160b, a sixth encapsulant 1460b, a sixth redistribution structure 1150, and a seventh redistribution structure 1450. The semiconductor package 300k may include a structure in which the fifth encapsulant 1160b surrounds the sixth semiconductor chip 1120. The semiconductor package 300k may include a structure in which the sixth encapsulant 1460b surrounds the fifth semiconductor chip 1420.

Referring to FIG. 5A, FIG. 5B, FIG. 5C, FIG. 5D, and FIG. 5F, according to a method of manufacturing a semiconductor package according to an embodiment, the semiconductor package may be sequentially manufactured as illustrated from a first structure 300k-1 to an eighth structure 300k-8. The semiconductor package of FIGS. 1A to 4B is not limited to the method of manufacturing the semiconductor package of FIGS. 5A to 5F.

A first structure 300k-1 may include a structure in which a second redistribution structure 150 is formed on a carrier substrate 510. For example, the carrier substrate 510 may be a detachable copper foil (DCF) carrier substrate. For example, a process of forming second redistribution layers 152 and second vias 153 may use a structure containing a material that may be exposed and developed, such as a photoresist.

A second structure 300k-2 may include a structure in which the second semiconductor chip 120 and the third semiconductor chip 130 are mounted on an upper surface of the second redistribution structure 150. Depending on a design, a combined structure of the second semiconductor chip 120 and the third semiconductor chip 130 may be replaced with the combined structure of the second semiconductor chip 120 and the third semiconductor chip 130 of FIG. 1A, FIG. 1B, and FIG. 1D.

A third structure 300k-3 may include a structure in which a second encapsulant 160b contacts and surrounds the second semiconductor chip 120 and the third semiconductor chip 130, respectively, and may be a structure capable of being tested through a lower surface of the second redistribution structure 150. For example, probes of a tester used for verification may be moved into contact with a position electrically connected to the second redistribution layers on the lower surface of the second redistribution structure 150. The tester may be used to verify whether a combined structure of the second redistribution structure 150 and the second semiconductor chip 120 is defective using resistance values measured by the tester. When the combined structure of the second redistribution structure 150 and the second semiconductor chip 120 includes a defect, the combined structure may be discarded, and the method of manufacturing the semiconductor package may be restarted.

A fourth structure 300k-4 may have a structure in which the third structure 300k-3, a first semiconductor chip 250, and a core member 168a are disposed on one surface of a carrier substrate 520. The core member 168a may be replaced with the conductive post of FIGS. 1A to 2D, depending on a design, and the first semiconductor chip 250 may be replaced with the combined structure of the first and fourth semiconductor chips of FIGS. 2A to 2D depending on a design.

A fifth structure 300k-5 may have a structure in which a first redistribution structure 110 is formed on one surface of the first semiconductor chip 250 and one surface of the second redistribution structure 150. The second redistribution structure 150 may be formed directly on the first redistribution structure 110. Therefore, there may be no bump between the first redistribution structure 110 and the second redistribution structure 150.

A sixth structure 300k-6 may have a structure in which a carrier substrate 530 is disposed on one surface of the first redistribution structure 110, and the carrier substrate 520 is separated.

A seventh structure 300k-7 may have a structure in which the third redistribution structure 185 is formed on a different surface of the first semiconductor chip 250 and a different surface of a second encapsulant 160b.

An eighth structure 300k-8 may have a structure in which a fifth redistribution structure 1110, a PoP bump 1118, a PoP UBM 1119, a sixth semiconductor chip 1120, a seventh semiconductor chip 1130, a sixth redistribution structure 1150, a fourth encapsulant 1160a, a fifth encapsulant 1160b, a fifth semiconductor chip 1420, an eighth semiconductor chip 1430, a seventh redistribution structure 1450, and a sixth encapsulant 1460b are disposed on one surface of the third redistribution structure 185.

Since a semiconductor package according to an embodiment may have a structure in which a sub-semiconductor package capable of being verified in advance is embedded, a probability of an occurrence of a defect may be reduced or a degree of freedom in designing a package-on-package (PoP) may be increased.

While embodiments have been illustrated and described above, it will be apparent to those skilled in the art that modifications and variations could be made without departing from the scope of the present inventive concept as defined by the appended claims.

The invention claimed is:

1. A semiconductor package comprising:
 a first redistribution structure;
 a third redistribution structure electrically connected to the first redistribution structure;
 a first semiconductor chip disposed between the first redistribution structure and the third redistribution structure;
 a second semiconductor chip disposed between the first redistribution structure and the third redistribution structure; and
 a second redistribution structure disposed between the second semiconductor chip and the first redistribution structure,
 wherein the first semiconductor chip does not overlap the second redistribution structure in a direction in which the first redistribution structure and the third redistribution structure face each other.

2. The semiconductor package of claim 1, further comprising a third semiconductor chip disposed between the second redistribution structure and the third redistribution structure,
 wherein the second semiconductor chip and the third semiconductor chip do not overlap each other in a direction in which the first redistribution structure and the third redistribution structure face each other.

3. The semiconductor package of claim 1, further comprising a third semiconductor chip disposed between the second redistribution structure and the third redistribution structure,
 wherein the second semiconductor chip and the third semiconductor chip overlap each other in a direction in which the first redistribution structure and the third redistribution structure face each other.

4. The semiconductor package of claim 3, wherein the second semiconductor chip comprises a first connection pad disposed on a surface facing the third semiconductor chip, and a first intermediate dielectric layer surrounding the first connection pad, and the third semiconductor chip comprises a second connection pad disposed on a surface facing the second semiconductor chip, and a second intermediate dielectric layer surrounding the second connection pad, wherein the first connection pad and the second connection pad are in contact with each other, and the first intermediate dielectric layer and the second intermediate dielectric layer are in contact with each other.

5. The semiconductor package of claim 3, further comprising:

a first bump electrically connected to the first redistribution structure and the first semiconductor chip;

a second bump electrically connected to the second redistribution structure and the second semiconductor chip; and a third bump electrically connected to the second semiconductor chip and the third semiconductor chip.

6. The semiconductor package of claim 3, further comprising a wire bypassing the second semiconductor chip and electrically connected to a surface of the third semiconductor chip facing the third redistribution structure and the second redistribution structure.

7. The semiconductor package of claim 3, further comprising a fourth redistribution structure disposed between the first semiconductor chip and the first redistribution structure, wherein the second semiconductor chip and the third semiconductor chip do not overlap the fourth redistribution structure in a direction in which the first redistribution structure and the third redistribution structure face each other.

8. The semiconductor package of claim 7, further comprising a fourth semiconductor chip disposed between the first semiconductor chip and the third redistribution structure, wherein the first semiconductor chip and the fourth semiconductor chip overlap each other in a direction in which the first redistribution structure and the third redistribution structure face each other.

9. The semiconductor package of claim 8, wherein the second redistribution structure is disposed directly on the first redistribution structure, and the fourth redistribution structure is disposed directly on the first redistribution structure.

10. The semiconductor package of claim 1, further comprising:

a core insulating layer disposed between the first redistribution structure and the third redistribution structure and surrounding the first semiconductor chip and the second semiconductor chip; and a conductive core via passing through the core insulating layer and electrically connected to the first redistribution structure and the third redistribution structure.

11. The semiconductor package of claim 10, further comprising:

a fifth semiconductor chip disposed on a surface, opposite to a surface of the third redistribution structure facing the first redistribution structure;

a fifth redistribution structure electrically connected between the fifth semiconductor chip and the third redistribution structure; and a package-on-package bump electrically connected to the third redistribution structure and the fifth redistribution structure.

12. The semiconductor package of claim 1, further comprising:

a second encapsulant disposed between the first redistribution structure and the third redistribution structure and encapsulating the second semiconductor chip; and a first encapsulant disposed between the first redistribution structure and the third redistribution structure and surrounding the second encapsulant, wherein each of the first redistribution structure, the second redistribution structure, and the third redistribution structure comprises, respectively, at least one redistribution layer and at least one insulating layer, alternately stacked.

13. A semiconductor package comprising:

a first redistribution structure in which at least one first redistribution layer and at least one first insulating layer are alternately stacked;

a first semiconductor chip disposed on a surface of the first redistribution structure;

a third semiconductor chip disposed on the surface of the first redistribution structure;

a second semiconductor chip disposed between the third semiconductor chip and the first redistribution structure;

a second redistribution structure disposed between the second semiconductor chip and the first redistribution structure, and in which at least one second redistribution layer and at least one second insulating layer are alternately stacked;

a second encapsulant surrounding the second semiconductor chip and surrounding the third semiconductor chip on a surface of the second redistribution structure; and a first encapsulant surrounding the first semiconductor chip and surrounding the second encapsulant on the surface of the first redistribution structure.

14. The semiconductor package of claim 13, further comprising:

a fourth semiconductor chip disposed on a surface of the first semiconductor chip, opposite to a surface of the first semiconductor chip facing the first redistribution structure; and a third encapsulant surrounding the first semiconductor chip and the fourth semiconductor chip, and surrounded by the first encapsulant on the surface of the first redistribution structure.

15. The semiconductor package of claim 14, further comprising:

a third redistribution structure electrically connected to the first redistribution structure and in which at least one third redistribution layer and at least one third insulating layer are alternately stacked; and a fourth redistribution structure disposed between the first semiconductor chip and the first redistribution structure, and in which at least one fourth redistribution layer and at least one fourth insulating layer are alternately stacked, wherein the first semiconductor chip, the second semiconductor chip, the third semiconductor chip, and the fourth semiconductor chip are disposed between the first redistribution structure and the third redistribution structure.

16. The semiconductor package of claim 15, further comprising:

a fifth semiconductor chip disposed on the third redistribution structure, opposite to a surface of the third redistribution structure facing the first redistribution structure;

a fifth redistribution structure electrically connected between the fifth semiconductor chip and the third redistribution structure, and in which at least one fifth redistribution layer and at least one fifth insulating layer are alternately stacked; and a package-on-package bump electrically connected to the third redistribution structure and the fifth redistribution structure.

17. The semiconductor package of claim 16, further comprising:

a sixth semiconductor chip disposed on the fifth redistribution structure, opposite to a surface of the fifth redistribution structure facing the third redistribution structure; and a sixth redistribution structure disposed between the sixth semiconductor chip and the fifth redistribution structure, and in which at least one sixth redistribution layer and at least one sixth insulating layer are alternately stacked, wherein the fifth semiconductor chip does not overlap the sixth redistribution structure in a direction in which the fifth redistribution structure and the sixth redistribution structure face each other.

18. A semiconductor package comprising:

a first redistribution structure in which at least one first redistribution layer and at least one first insulating layer are alternately stacked;

a third redistribution structure electrically connected to the first redistribution structure and in which at least one third redistribution layer and at least one third insulating layer are alternately stacked;

a first semiconductor chip disposed between the first redistribution structure and the third redistribution structure;

a second semiconductor chip disposed between the first redistribution structure and the third redistribution structure;

a third semiconductor chip disposed between the second semiconductor chip and the third redistribution structure;

a second encapsulant disposed between the first redistribution structure and the third redistribution structure, surrounding the second semiconductor chip, and surrounding the third semiconductor chip;

a first encapsulant disposed between the first redistribution structure and the second redistribution structure, surrounding the first semiconductor chip, and surrounding the second encapsulant;

a second redistribution structure disposed between the second semiconductor chip and the first redistribution structure, and in which at least one second redistribution layer and at least one second insulating layer are alternately stacked, wherein the second redistribution structure is disposed directly on the first redistribution structure, and wherein the first semiconductor chip does not overlap the second redistribution structure in a direction in which the first redistribution structure and the third redistribution structure face each other.

19. The semiconductor package of claim 18, further comprising:

a fourth semiconductor chip disposed between the first semiconductor chip and the third redistribution structure;

a third encapsulant disposed between the first redistribution structure and the third redistribution structure, surrounding the first semiconductor chip, surrounding the fourth semiconductor chip, and surrounded by the first encapsulant; and a fourth redistribution structure disposed between the first semiconductor chip and the first redistribution structure, in which at least one fourth redistribution layer and at least one fourth insulating layer are alternately stacked, wherein the fourth redistribution structure is disposed directly on the first redistribution structure, and wherein the second and third semiconductor chips do not overlap the fourth redistribution structure in a direction in which the first and third redistribution structures face each other.

20. The semiconductor package of claim 18, further comprising:

a core insulating layer disposed between the first redistribution structure and third redistribution structure and surrounding the first encapsulant and the second encapsulant; and a conductive core via passing through the core insulating layer and electrically connected to the first redistribution structure and the third redistribution structure;

a fifth semiconductor chip disposed on a surface of the third redistribution structure, opposite to a surface of the third redistribution structure facing the first redistribution structure;

a fifth redistribution structure electrically connected between the fifth semiconductor chip and the third redistribution structure, and in which at least one fifth redistribution layer and at least one fifth insulating layer are alternately stacked; and a package-on-package bump electrically connected to the third redistribution structure and the fifth redistribution structure.

\* \* \* \* \*